(12) United States Patent
Kitajima

(10) Patent No.: US 11,009,739 B2
(45) Date of Patent: May 18, 2021

(54) PHOTOSENSITIVE COMPOSITION, COLOR FILTER, PATTERN FORMING METHOD, SOLID-STATE IMAGING DEVICE, AND IMAGE DISPLAY DEVICE

(71) Applicant: FUJIFILM Corporation, Tokyo (JP)

(72) Inventor: Shunsuke Kitajima, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 431 days.

(21) Appl. No.: 16/137,856

(22) Filed: Sep. 21, 2018

(65) Prior Publication Data

US 2019/0018282 A1 Jan. 17, 2019

Related U.S. Application Data

(63) Continuation of application No. PCT/JP2017/011186, filed on Mar. 21, 2017.

(30) Foreign Application Priority Data

Mar. 25, 2016 (JP) .............................. JP2016-061485

(51) Int. Cl.
| | |
|---|---|
| G02B 5/20 | (2006.01) |
| G03F 7/031 | (2006.01) |
| G02F 1/1335 | (2006.01) |
| G03F 7/027 | (2006.01) |
| G03F 7/00 | (2006.01) |
| G03F 7/105 | (2006.01) |
| C09B 47/10 | (2006.01) |
| G02B 5/22 | (2006.01) |
| G03F 7/038 | (2006.01) |

(52) U.S. Cl.
CPC ........ *G02F 1/133514* (2013.01); *C09B 47/10* (2013.01); *G02B 5/20* (2013.01); *G02B 5/201* (2013.01); *G02B 5/223* (2013.01); *G03F 7/0007* (2013.01); *G03F 7/027* (2013.01); *G03F 7/031* (2013.01); *G03F 7/038* (2013.01); *G03F 7/105* (2013.01)

(58) Field of Classification Search
CPC ........ G03F 7/0007; G03F 7/027; G03F 7/031; G03F 7/105; G03F 7/2004; G02B 5/223; G02F 1/133514; G02F 1/133516; C09B 47/10
USPC .................... 430/7, 281.1; 349/106
See application file for complete search history.

(56) References Cited

U.S. PATENT DOCUMENTS

| | | | | |
|---|---|---|---|---|
| 2008/0160432 A1* | 7/2008 | Byon | ...................... | G03F 7/027 430/7 |
| 2010/0239965 A1* | 9/2010 | Takakuwa | ............ | C08K 5/0008 430/7 |
| 2012/0182638 A1* | 7/2012 | Takakuwa | ........... | C09B 67/0069 359/892 |
| 2016/0139505 A1* | 5/2016 | Taguchi | ................. | G02B 5/201 430/7 |
| 2017/0009075 A1* | 1/2017 | Sakamoto | ............... | C09B 47/10 |
| 2017/0363959 A1* | 12/2017 | Takahashi | ............. | H01L 27/146 |

FOREIGN PATENT DOCUMENTS

| | | |
|---|---|---|
| JP | 2010-256891 A | 11/2010 |
| JP | 2011-099974 A | 5/2011 |
| JP | 2011-118275 A | 6/2011 |
| JP | 2012-93395 A | 5/2012 |
| JP | 2012-172003 A | 9/2012 |
| JP | 2012-173327 A | 9/2012 |
| JP | 2013-117645 A | 6/2013 |
| JP | 2013-152278 A | 8/2013 |
| JP | 2013-174920 A | 9/2013 |
| JP | 2014-052470 A | 3/2014 |
| JP | 2014-137466 A | 7/2014 |
| JP | 2014-202802 A | 10/2014 |
| JP | 2015-125402 A | 7/2015 |
| JP | 2016-191047 A | 11/2016 |
| WO | 2008/078678 A1 | 7/2008 |

OTHER PUBLICATIONS

Office Action dated Dec. 22, 2020 from the Intellectual Property Office of Taiwan in TW Application No. 106109078.
Office Action dated May 4, 2020 by the Korean Intellectual Property Office in Korean application No. 10-2018-7027317.
International Search Report of PCT/JP2017/011186 dated Jun. 13, 2017.
International Preliminary Report on Patentability with English translation of the Written Opinion of PCT/JP2017/011186 dated Sep. 25, 2018.
Written Opinion of PCT/JP2017/011186 dated Jun. 13, 2017.
Office Action dated Nov. 5, 2019 from the Japanese Patent Office in Japanese Application No. 2018-507326.
Office Action dated Mar. 10, 2020, from the Japanese Patent Office in Japanese Application No. 2018-507326.
Office Action dated Jul. 9, 2019, from the Japanese Patent Office in counterpart Japanese application No. 2018-507326.
Office Action dated Nov. 18, 2019, from the Korean Intellectual Property Office in Korean application No. 10-2018-7027317.

* cited by examiner

*Primary Examiner* — John A McPherson
(74) *Attorney, Agent, or Firm* — Sughrue Mion, PLLC

(57) ABSTRACT

Provided are a photosensitive composition capable of forming a cured film having excellent adhesiveness and pattern forming properties, a color filter, a pattern forming method, a solid-state imaging device, and an image display device. The photosensitive composition includes a photopolymerization initiator I, a polymerizable monomer M having two or more groups having an ethylenically unsaturated double bond, and a halogenated zinc phthalocyanine, in which the polymerizable monomer M contains a polymerizable monomer $M^1$ having three groups having an ethylenically unsaturated double bond, the photopolymerization initiator I contains a photopolymerization initiator $I^1$ having a molar light absorption coefficient at a wavelength of 365 nm of 12,000 $L \cdot mol^{-1} \cdot cm^{-1}$ or more, and the ratio of the mass of the photopolymerization initiator I to the mass of the polymerizable monomer M is 0.15 or less in terms of the mass of the photopolymerization initiator I/the mass of the polymerizable monomer M.

11 Claims, No Drawings

PHOTOSENSITIVE COMPOSITION, COLOR FILTER, PATTERN FORMING METHOD, SOLID-STATE IMAGING DEVICE, AND IMAGE DISPLAY DEVICE

CROSS-REFERENCE TO RELATED APPLICATIONS

This application is a Continuation of PCT International Application No. PCT/JP2017/011186 filed on Mar. 21, 2017, which claims priority under 35 U.S.C § 119(a) to Japanese Patent Application No. 2016-061485 filed on Mar. 25, 2016. Each of the above application(s) is hereby expressly incorporated by reference, in its entirety, into the present application.

BACKGROUND OF THE INVENTION

1. Field of the Invention

The present invention relates to a photosensitive composition, a color filter, a pattern forming method, a solid-state imaging device, and an image display device.

2. Description of the Related Art

As a digital camera, a mobile phone with a camera, and the like have been further spreading in recent years, there has been an increasing demand for a solid-state imaging device such as a charge-coupled device (CCD) image sensor. A color filter has been used as a key device in a display or an optical element.

A color filter has been formed using a photosensitive composition including a coloring agent, a polymerizable monomer, and a photopolymerization initiator.

For example, JP2010-256891A describes a photosensitive composition including a pigment, a transparent resin, a photopolymerizable compound, and a photopolymerization initiator including an oxime compound having a nitro group.

Furthermore, investigations have recently been conducted on use of a halogenated zinc phthalocyanine in order to secure a broader color gamut and increase color reproducibility (see JP2012-173327A).

SUMMARY OF THE INVENTION

According to the investigation of the present inventors, it could be seen that a halogenated zinc phthalocyanine has a particularly low transmittance to i-rays, as compared with other phthalocyanines (for example, a halogenated copper phthalocyanine and a non-halogenated phthalocyanine). Thus, it could be seen that there is tendency that in a case where a cured film is formed using a photosensitive composition including a halogenated zinc phthalocyanine, the adhesiveness to a substrate of a cured film, or the like is insufficient. In particular, in a case where the concentration of a halogenated zinc phthalocyanine in the photosensitive composition was increased or the thickness of the cured film was increased, the adhesiveness to a substrate of a cured film, or the like was likely to be insufficient.

On the other hand, in a case of enhancing the adhesiveness to a substrate of a cured film, or the like, a method for increasing the content of a photopolymerization initiator has been considered, but with this method, there has been tendency that a pattern has a line width that is more than a desired line width in the pattern formation, and thus, pattern forming properties were easily lowered.

As such, it has been difficult to satisfy both adhesiveness and pattern forming properties in their trade-off relationship. Such a problem tended to be more significant in a case where a halogenated zinc phthalocyanine was used.

Therefore, an object of the present invention is to provide a photosensitive composition capable of forming a cured film having excellent adhesiveness and pattern forming properties, a color filter, a pattern forming method, a solid-state imaging device, and an image display device.

The present inventors have conducted extensive studies, and as a result, they have found that the object can be accomplished by using a photosensitive composition which will be described later, leading to the completion of the present invention. That is, the present invention is as follows.

<1> A photosensitive composition comprising:
a photopolymerization initiator I;
a polymerizable monomer M having two or more groups having an ethylenically unsaturated double bond; and
a halogenated zinc phthalocyanine,
in which the polymerizable monomer M contains a polymerizable monomer $M^1$ having three groups having an ethylenically unsaturated double bond,
the photopolymerization initiator I includes a photopolymerization initiator $I^1$ having a molar light absorption coefficient at a wavelength of 365 nm of 12,000 $L \cdot mol^{-1} \cdot cm^{-1}$ or more, and
the ratio of the mass of the photopolymerization initiator I to the mass of the polymerizable monomer M is 0.15 or less in terms of the mass of the photopolymerization initiator I/the mass of the polymerizable monomer M.

<2> The photosensitive composition as described in <1>,
in which the polymerizable monomer M contains 50% to 100% by mass of the polymerizable monomer $M^1$.

<3> The photosensitive composition as described in <1> or <2>,
in which the polymerizable monomer $M^1$ has an alkyleneoxy group.

<4> The photosensitive composition as described in any one of <1> to <3>,
in which the photopolymerization initiator $I^1$ includes at least one selected from an oxime compound having a nitro group and an oxime compound having a naphthalene ring.

<5> The photosensitive composition as described in any one of <1> to <4>,
in which the photopolymerization initiator $I^1$ contains a compound represented by Formula (I-1),

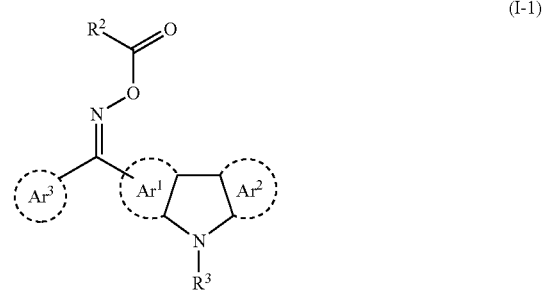

(I-1)

in Formula (I-1), $Ar^1$ and $Ar^2$ each independently represent an aromatic ring,
$Ar^3$ represents an aryl group,
$R^2$ and $R^3$ each independently represent an alkyl group or an aryl group, and at least one of $Ar^1$ to $Ar^3$, $R^2$, or $R^3$ has a fluorine atom, a group including a fluorine atom, or a nitro group as a substituent.

<6> The photosensitive composition as described in any one of <1> to <5>, in which the polymerizable monomer M contains 50% by mass or less of a polymerizable monomer $M^2$ having four or more groups having an ethylenically unsaturated double bond.

<7> A color filter using the photosensitive composition as described in any one of <1> to <6>.

<8> A pattern forming method comprising:

a step of forming a photosensitive composition layer on a support, using the photosensitive composition as described in any one of <1> to <6>;

a step of patternwise exposing the photosensitive composition layer; and a step of removing the unexposed area by development to form a pattern.

<9> The pattern forming method as described in <8>, in which the exposure is carried out with i-rays.

<10> A solid-state imaging device comprising the color filter as described in <7>.

<11> An image display device comprising the color filter as described in <7>.

According to the present invention, it is possible to provide a photosensitive composition capable of forming a cured film having excellent adhesiveness and pattern forming properties, a color filter, a pattern forming method, a solid-state imaging device, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light included in the exposure include a bright line spectrum of a mercury lamp, far ultraviolet rays typified by an excimer laser, extreme ultraviolet rays (EUV light), X-rays, electron beams, or the like.

In the present specification, a numerical range expressed using "to" means a range that includes the preceding and succeeding numerical values of "to" as the lower limit value and the upper limit value, respectively.

In the present specification, the total solid content refers to a total mass of the components remaining in a case where a solvent is excluded from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" not only represents an independent step, but also includes a step which is not clearly distinguished from other steps in a case where an intended action of the step is obtained.

In the present specification, a weight-average molecular weight (Mw) and a number-average molecular weight (Mn) are defined as values in terms of polystyrene through measurement by means of gel permeation chromatography (GPC).

In the present specification, a pigment means an insoluble compound which is sparingly soluble in a specific solvent. It typically means a compound which exists in a state where it is dispersed as particles in a composition. The pigment used in the present invention preferably has a solubility at 25° C. of, for example, 0.1 g/100 g Solvent or less in either of propylene glycol monomethyl ether acetate and water.

<Photosensitive Composition>

The photosensitive composition of the present invention includes:

a photopolymerization initiator I, a polymerizable monomer M having two or more groups having an ethylenically unsaturated double bond, and a halogenated zinc phthalocyanine, in which the polymerizable monomer M contains a polymerizable monomer $M^1$ having three groups having an ethylenically unsaturated double bond, the photopolymerization initiator I includes a photopolymerization initiator $I^1$ having a molar light absorption coefficient at a wavelength of 365 nm of 12,000 $L \cdot mol^{-1} \cdot cm^{-1}$ or more, and the ratio of the mass of the photopolymerization initiator I to the mass of the polymerizable monomer M is, 0.15 or less in terms of the mass of the photopolymerization initiator I/the mass of the polymerizable monomer M.

According to the present invention, a photosensitive composition capable of forming a cured film having excellent adhesiveness and pattern forming properties is obtained. A reason for obtaining such an effect is presumed to be as follows.

That is, it is presumed that the sensitivity to i-rays in a photosensitive composition including a halogenated zinc phthalocyanine can be improved by using a photopolymerization initiator $I^1$ having a molar light absorption coefficient at a wavelength of 365 nm of 12,000 $L \cdot mol^{-1} \cdot cm^{-1}$ or more as the photopolymerization initiator I. By this, it is possible to cure the film to the lower part thereof (an interface with a support) in the formation of the film on a support using a photosensitive composition including a halogenated zinc phthalocyanine, and thus increase the adhesiveness to a support.

In addition, in a case of extremely increasing the sensitivity to i-rays, there is tendency that pattern forming properties are deteriorated, but according to the present invention, it is possible to suppress the sensitivity of the photosensitive composition from being extremely increased by using the polymerizable monomer M which contains a polymerizable monomer $M^1$ having three groups having an ethylenically unsaturated double bond, and setting the ratio of the mass of the photopolymerization initiator I to the mass of the polymerizable monomer M (the mass of the photopolymerization initiator I/the mass of the polymerizable monomer M) to 0.15 or less. This is presumed to make it possible to increase the adhesiveness onto a support or the like while maintaining excellent pattern forming properties.

In the formation of a film having a thickness of 2.0 μm after drying using the photosensitive composition of the present invention, the optical density of the film at a wavelength of 365 nm is preferably 2.0 or more, more preferably 2.1 or more, and still more preferably 2.2 or more. The upper limit is not particularly limited, but can be set to 5.0 or less. As the optical density of the film at a wavelength of 365 nm is higher, it has been difficult to form a film having good adhesiveness to a support in the related art, but according to the present invention, it is possible to form a film having a high optical density of the film at a wavelength of 365 nm with good adhesiveness to a support. By this, as the optical density is higher, the effect of the present invention is remarkable.

Furthermore, the optical density is a value expressing an absorption degree in a logarithmic number, which is defined by the following formula.

$$OD(\lambda)=\text{Log } 10[T(\lambda)/I(\lambda)]$$

$\lambda$ represents a wavelength, $T(\lambda)$ represents the amount of light transmitted at a wavelength of $\lambda$, and $I(\lambda)$ represents the amount of incident light at a wavelength of $\lambda$.

In order to set the optical density of a film at a wavelength of 365 nm to 2.0 or more in the formation of a film having a thickness of 2.0 µm after drying, the optical density can be achieved, for example, by incorporating a coloring agent that absorbs light at a wavelength of 365 nm or appropriately adjusting the content of the coloring agent in the total solid content. For example, a method in which the content of a halogenated zinc phthalocyanine is increased can be exemplified.

Moreover, in the present invention, the optical density of the film is a value by making light at a wavelength of 365 nm incident, and measuring a transmittance thereof using a spectroscope UV4100 (manufactured by Hitachi High-Technologies Corporation).

Hereinafter, the respective components of the photosensitive composition of the present invention will be described.

<<Halogenated Zinc Phthalocyanine>>

The photosensitive composition of the present invention includes a halogenated zinc phthalocyanine. The halogenated zinc phthalocyanine is a compound in which zinc as the central metal is positioned within a region surrounded by four nitrogen atoms of an isoindole ring.

The halogenated zinc phthalocyanine may be a dye (halogenated zinc phthalocyanine dye), but is preferably a pigment (halogenated zinc phthalocyanine pigment). With regard to the halogenated zinc phthalocyanine dye, reference can be made to the description in JP2014-043555A and JP2014-043556A, the contents of which are incorporated herein by reference.

The halogenated zinc phthalocyanine pigment is preferably a compound represented by Formula (A1).

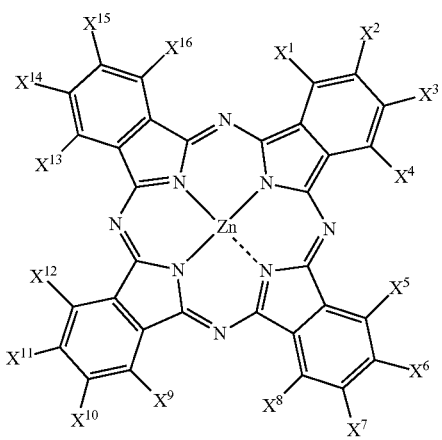

(A1)

It is preferable that in Formula (A1), any 8 to 16 members of $X^1$ to $X^{16}$ each independently represent a halogen atom, and the others each represent a hydrogen atom or a substituent.

Examples of the halogen atom include a chlorine atom, a bromine atom, a fluorine atom, and an iodine atom, with the bromine atom or the chlorine atom being particularly preferable. With regard to the substituent, reference can be made to the description in paragraph Nos. 0025 to 0027 of JP2013-209623A, the contents of which are incorporated herein by reference.

As for specific examples of the halogenated zinc phthalocyanine pigment, for example, the aspects shown in <1> and <2> below may be mentioned as preferred examples.

<1> A halogenated zinc phthalocyanine pigment in which the average number of halogen atoms per molecule of the phthalocyanine is 8 to 12. In this aspect, it is preferable that $X^1$ to $X^{16}$ include one or more in total of chlorine atoms, bromine atoms, or hydrogen atoms. In addition, it is preferable that $X^1$ to $X^{16}$ have 0 to 4 chlorine atoms, 8 to 12 bromine atoms, and 0 to 4 hydrogen atoms. With regard to the specific examples, reference can be made to the description in paragraph Nos. 0013 to 0039, and 0084 to 0085 of JP2007-284592A, the contents of which are incorporated herein by reference.

<2> A halogenated zinc phthalocyanine pigment in which the average number of halogen atoms per molecule of the phthalocyanine is 10 to 14, and the average number of bromine atoms per molecule of the phthalocyanine is 8 to 12, and the average number of chlorine atoms per molecule of the phthalocyanine is 2 to 5. Specific examples thereof include the compounds described in WO2015/118720A.

Examples of the halogenated zinc phthalocyanine pigment include C. I. Pigment Green 58, 59, and the like which are compounds classified into a pigment in Color Index (C. I.; published by The Society of Dyers and Colourists).

The content of the halogenated zinc phthalocyanine is preferably 10% by mass or more, more preferably 20% by mass or more, and still more preferably 30% by mass or more, with respect to the total solid content in the photosensitive composition. The upper limit is preferably 80% by mass or less, more preferably 75% by mass or less, and still more preferably 70% by mass or less.

The content of the halogenated zinc phthalocyanine pigment is preferably 10% by mass or more, more preferably 20% by mass or more, and still more preferably 30% by mass or more, with respect to the total solid content in the photosensitive composition. The upper limit is preferably 80% by mass or less, more preferably 75% by mass or less, and still more preferably 70% by mass or less. The halogenated zinc phthalocyanine pigment may be of one kind or may include two or more kinds of compounds having different combinations of $X^1$ to $X^{16}$ of Formula (A1). In a case where two or more kinds of the compounds are included, the total amount thereof preferably falls within the range.

<<Other Coloring Agent>>

The photosensitive composition of the present invention may further include a coloring agent (another coloring agent) other than the halogenated zinc phthalocyanine. Such another coloring agent may be either of a dye and a pigment, both of which may be used in combination. Examples of the pigment include various inorganic pigments or organic pigments known in the related art. Further, taking into consideration that whether it is an inorganic pigment or an organic pigment, a pigment having a high transmittance is preferable, a pigment having an average particle diameter which is as small as possible is preferably used, and taking handleability into consideration, the average particle diameter of the pigments is preferably 0.01 to 0.1 μm, and more preferably 0.01 to 0.05 μm.

Examples of the inorganic pigments include a black pigment, and a metal compound such as a metal oxide and a metal complex salt, and specific examples thereof include black pigments such as carbon black and titanium black, oxides of metals such as iron, cobalt, aluminum, cadmium, lead, copper, titanium, magnesium, chromium, zinc, and antimony, and complex oxides of the metals.

Examples of the organic pigments include the following ones. C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279

C. I. Pigment Green 7, 10, 36, 37

C. I. Pigment Violet 1, 19, 23, 27, 32, 37, 42

C. I. Pigment Blue 1, 2, 15, 15:1, 15:2, 15:3, 15:4, 15:6, 16, 22, 60, 64, 66, 79, 80

These organic pigments may be used singly or in various combinations.

As the dye, for example, the colorants disclosed in JP1989-90403A (JP-S64-90403A), JP1989-91102A (JP-S64-91102A), JP1989-94301A (JPH01-94301A), JP1994-11614A (JP-H06-11614A), JP2592207B, U.S. Pat. No. 4,808,501A, U.S. Pat. No. 505,950A, U.S. Pat. No. 5,667,920A, JP1993-333207A (JP-H05-333207A), JP1994-35183A (JP-H06-35183A), JP1994-51115A (JP-H06-51115A), JP1994-194828A (JP-H06-194828A), and the like can be used. With respect to the chemical structure, a pyrazoleazo compound, a pyrromethene compound, an anilinoazo compound, a triphenylmethane compound, an anthraquinone compound, a benzylidene compound, an oxonol compound, a pyrazoletriazole azo compound, a pyridoneazo compound, a cyanine compound, a phenothiazine compound, a pyrrolopyrazoleazomethine compound, or the like can be used.

Furthermore, a colorant multimer may be used. The colorant multimer is preferably a dye which is used after being dissolved in a solvent, but the colorant multimer may form a particle. In a case where the colorant multimer is the particle, the colorant multimer is usually used in a state of being dispersed in a solvent. The colorant multimer in the particle state can be obtained by, for example, emulsion polymerization, and specific examples thereof include the compounds and production methods described in JP2015-214682A. In addition, as the colorant multimer, the compounds described in JP2011-213925A, JP2013-041097A, JP2015-028144A, JP2015-030742A, and the like can also be used.

Furthermore, as the yellow coloring agent, the quinophthalone compounds described in paragraph Nos. 0011 to 0034 of JP2013-54339A, the quinophthalone compounds described in paragraph Nos. 0013 to 0058 of JP2014-26228A, and the like which are yellow coloring agents can also be used.

Moreover, as the blue pigment, an aluminum phthalocyanine compound having a phosphorus atom can also be used. Specific examples thereof include the compounds described in paragraph Nos. 0022 to 0030 of JP2012-247591A, and the compounds described in paragraph No. 0047 of JP2011-157478A.

In the present invention, such the other coloring agent is preferably a yellow coloring agent. Examples of the yellow coloring agent include an azo compound, a quinophthalone compound, a pyrazolone compound, a benzimidazolone compound, a quinoxaline compound, an azomethine compound, a quinophthalone compound, an isoindolinone compound, an isoindoline compound, and an anthraquinone compound. According to this aspect, good spectroscopy is easily obtained. In particular, a color filter having spectroscopy suitable as a color filter for forming a green pixel is easily produced.

In the present invention, such the other coloring agent is also preferably an isoindoline compound. According to this aspect, good spectroscopy is easily obtained.

In a case where the photosensitive composition of the present invention contains another coloring agent, the content of such the other coloring agent is preferably 10 to 100 parts by mass with respect to 100 parts by mass of the halogenated zinc phthalocyanine. The upper limit is more preferably 90 parts by mass or less, and still more preferably 80 parts by mass or less. The lower limit is more preferably 15 parts by mass or more, and still more preferably 20 parts by mass or more. Within the range, spectroscopy characteristics that are preferred in terms of color reproducibility are obtained.

<<Polymerizable Monomers>>

The photosensitive composition of the present invention includes a polymerizable monomer M having two or more groups having an ethylenically unsaturated double bond. Examples of the groups having an ethylenically unsaturated double bond include a vinyl group, a (meth)allyl group, a (meth)acryloyl group, and a (meth)acryloyloxy group. Examples of the polymerizable monomer M having two or more groups having an ethylenically unsaturated double bond include a bifunctional or higher (meth)acrylate. The polymerizable monomer M is preferably a radically polymerizable monomer.

In the present invention, the molecular weight of the polymerizable monomer M is preferably 100 to 3,000. The upper limit is more preferably 2,000 or less, still more preferably 1,500 or less, and even still more preferably 1,200 or less. the lower limit is more preferably 150 or more, and still more preferably 250 or more.

In the present invention, the polymerizable monomer M is preferably a compound other than a polymer. Examples of the compound other than a polymer include a compound not having a molecular weight distribution.

The content of the polymerizable monomer M is preferably 0.1% to 50% by mass with respect to the total solid content of the photosensitive composition. The lower limit is, for example, more preferably 0.5% by mass or more, and still more preferably 1% by mass or more. The upper limit is, for example, more preferably 45% by mass or less, and still more preferably 40% by mass or less. The polymerizable monomer M may be used singly or in combination of two or more kinds thereof. In a case where two or more of the polymerizable monomers M are used in combination, the total amount thereof preferably falls within the range.

In the present invention, as the polymerizable monomer M, a polymerizable monomer M containing a polymerizable monomer $M^1$ having three groups having an ethylenically unsaturated double bond (hereinafter also referred to as a trifunctional polymerizable monomer) is used. The trifunctional polymerizable monomer is preferably a trifunctional (meth)acrylate.

The molecular weight of the trifunctional polymerizable monomer is preferably 250 to 1,300. The upper limit is more preferably 850 or less. The lower limit is more preferably 290 or more.

The trifunctional polymerizable monomer may or may not have an acid group such as a carboxyl group, a sulfo group, and a phosphoric acid group. For a reason that the permeating properties of a developer are high, it is preferable that the trifunctional polymerizable monomer does not have an acid group. The trifunctional polymerizable monomer may or may not have a hydroxyl group. For a reason that the permeating properties of a developer are high, it is preferable that the trifunctional polymerizable monomer does not have a hydroxyl group.

The trifunctional polymerizable monomer preferably has an alkyleneoxy group. By using a trifunctional polymerizable monomer having an alkyleneoxy group, it is possible to impart flexibility suitable to a cured film formed from a photosensitive composition, and it is also possible to suppress pattern chipping, peeling, or the like during development, thereby further enhancing the adhesiveness or the residual film rate after development.

Examples of the trifunctional polymerizable monomer having an alkyleneoxy group include a compound represented by Formula (M-1).

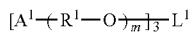

Formula (M-1)

In the formula, $A^1$ represents a group having an ethylenically unsaturated double bond, $R^1$ represents an alkylene group, m represents an integer of 1 to 30, and $L^1$ represents a trivalent linking group.

Examples of the group having an ethylenically unsaturated double bond represented by $A^1$ include a vinyl group, a (meth)allyl group, a (meth)acryloyl group, and a (meth) acryloyloxy group, with the (meth)acryloyloxy group being preferable.

The number of carbon atoms of the alkylene group represented by $R^1$ is preferably 1 to 10, more preferably 1 to 5, still more preferably 1 to 3, particularly preferably 2 or 3, and most preferably 2. The alkylene group represented by $R^1$ is preferably linear or branched, and more preferably linear. Specific examples of the alkylene represented by $R^1$ include an ethylene group and a linear or branched propylene group.

m represents an integer of 1 to 30, and is preferably an integer of 1 to 20, more preferably an integer of 1 to 10, still more preferably an integer of 1 to 5, particularly preferably 1 or 2, and most preferably 1.

Examples of the trivalent linking group represented by $L^1$ include an aliphatic hydrocarbon group, an aromatic hydrocarbon group, a heterocyclic group, a group formed by combination thereof, and a group formed by combination of at least one selected from an aliphatic hydrocarbon group, an aromatic hydrocarbon group, and a heterocyclic group and at least one selected from —O—, —CO—, —COO—, —OCO—, and —NH—, with the aliphatic hydrocarbon group being preferable.

The number of carbon atoms of the aliphatic hydrocarbon group represented by $L^1$ is preferably 1 to 30, more preferably 1 to 20, and still more preferably 1 to 15. The aliphatic hydrocarbon group may be in any one of linear, branched, and cyclic forms, and is preferably branched. The number of carbon atoms of the aromatic hydrocarbon group is preferably 6 to 30, more preferably 6 to 20, and still more preferably 6 to 10.

The heterocyclic group may be either a non-aromatic heterocyclic group or an aromatic heterocyclic group. The heterocyclic group is preferably a 5- or 6-membered ring. Examples of the kinds of heteroatoms constituting the heterocyclic group include a nitrogen atom, an oxygen atom, and a sulfur atom. The number of heteroatoms constituting the heterocyclic group is preferably 1 to 3. The heterocyclic group may be a monocycle or a fused ring.

The trifunctional polymerizable monomer having an alkyleneoxy group is preferably a compound represented by Formula (M-2).

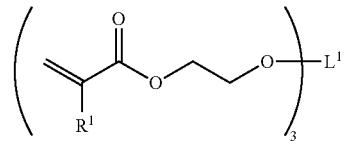

Formula (M-2)

In the formula, $L^1$ represents a trivalent linking group, $R^1$ represents a hydrogen atom or a methyl group. $L^1$ in Formula (M-2) has the same definition as $L^1$ in Formula (M-1), and a preferred range thereof is also the same.

Specific examples of the trifunctional polymerizable monomer include trimethylolpropane tri(meth)acrylate, trimethylolpropane propyleneoxy-modified tri(meth)acrylate, trimethylolpropane ethyleneoxy-modified tri(meth) acrylate, isocyanuric acid ethyleneoxy-modified tri(meth) acrylate, and pentaerythritol tri(meth)acrylate. In addition, compounds having the following structures are also included. Examples of commercially available products of the trifunctional polymerizable monomer include ARONIX M-309, M-310, M-321, M-350, M-360, M-313, M-315, M-306, M-305, M-303, M-452, and M-450 (manufactured by Toagosei Chemical Industry Co., Ltd.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

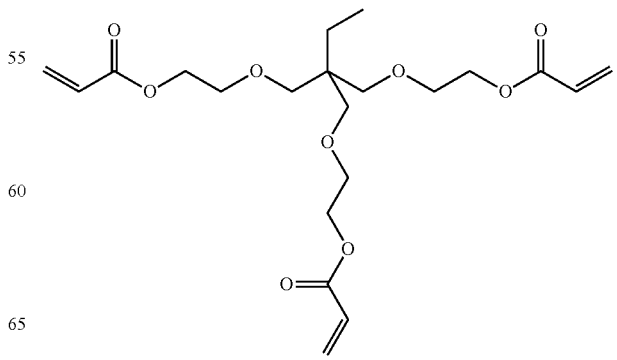

The trifunctional polymerizable monomer $M^1$ is preferably contained in the content of 50% by mass or more in the polymerizable monomer M. The lower limit of the content is more preferably 55% by mass or more, still more preferably 65% by mass or more, and even still more preferably 80% by mass or more. The upper limit may be 100% by mass.

One kind or two or more kinds of the trifunctional polymerizable monomers $M^1$ may be included. In a case where two or more kinds of the trifunctional polymerizable monomer $M^1$ are included, the total amount thereof preferably falls within the range.

In the present invention, the polymerizable monomer M is preferably in the following aspect of <1> or <2>.

<1> An aspect in which the polymerizable monomer M is constituted substantially only with a trifunctional polymerizable monomer $M^1$.

<2> An aspect in which the polymerizable monomer M is constituted with a trifunctional polymerizable monomer $M^1$ and a polymerizable monomer $M^2$ having four or more groups having an ethylenically unsaturated double bond (hereinafter also referred to as a tetrafunctional or higher polymerizable monomer).

According to the aspect of <1>, it is possible to further enhance the adhesiveness. Further, an expression, "the polymerizable monomer M is substantially constituted only with the trifunctional polymerizable monomer $M^1$" means that the content of the trifunctional polymerizable monomer $M^1$ in the polymerizable monomer M is preferably 99% by mass or more, and more preferably 99.5% by mass or more, and it is still more preferable that the polymerizable monomer M is constituted only with trifunctional polymerizable monomers.

According to the aspect of <2>, it is possible to enhance the permeating properties of a developer toward a cured film formed from a photosensitive composition. Incidentally, even in a case where pressure is applied onto a film during rising or the like by applying a suitable hardness to a cured film, a pattern can be hardly peeled, and thus, the residual film rate of a pattern after development can be enhanced.

In the aspect of <2>, the tetrafunctional or higher polymerizable monomer $M^2$ is preferably contained in the proportion of 50% by mass or less in the polymerizable monomer M. The upper limit of the proportion is more preferably 35% by mass or less, and still more preferably 20% by mass or less. The lower limit of the proportion is preferably 0.1% by mass or more, more preferably 1% by mass or more, and still more preferably 3% by mass or more. Further, the tetrafunctional or higher polymerizable monomer $M^2$ is included in the proportion of preferably 0.1 to 50 parts by mass, and more preferably 20 to 50 parts by mass, with respect to 100 parts by mass of the trifunctional polymerizable monomer $M^1$.

Moreover, in the aspect of <2>, it is preferable that a polymerizable monomer having two groups having an ethylenically unsaturated double bond (hereinafter also referred to as a bifunctional polymerizable monomer) is not substantially contained. An expression, "the bifunctional polymerizable monomer is not substantially contained" means that the content of the bifunctional polymerizable monomer in the polymerizable monomer M is preferably 1% by mass or less, and more preferably 0.5% by mass or less, and still more preferably, the bifunctional polymerizable monomer is not contained.

Furthermore, in the aspect of <2>, the average number of functional groups in the polymerizable monomer M is preferably 2.0 to 8.0, more preferably 2.5 to 7, and still more preferably 3.0 to 6.0.

The tetrafunctional or higher polymerizable monomer $M^2$ is preferably a polymerizable monomer having 4 to 15 groups having an ethylenically unsaturated double bond, more preferably a polymerizable monomer having 4 to 10 groups having an ethylenically unsaturated double bond, and still more preferably a polymerizable monomer having 4 to 6 groups having an ethylenically unsaturated double bond. The tetrafunctional or higher polymerizable monomer $M^2$ is preferably a tetrafunctional or higher (meth)acrylate.

With regard to the tetrafunctional or higher polymerizable monomer $M^2$, reference can be made to the compounds described in paragraph Nos. 0095 to 0108 of JP2009-288705A, paragraph No. 0227 of JP2013-29760A, and paragraph Nos. 0254 to 0257 of JP2008-292970A, the contents of which are incorporated herein by reference.

As the tetrafunctional or higher polymerizable monomer $M^2$, dipentaerythritol tetraacrylate (KAYARAD D-320; manufactured by Nippon Kayaku Co., Ltd., as a commercially available product), dipentaerythritol penta(meth)acrylate (KAYARAD D-310; manufactured by Nippon Kayaku Co., Ltd., as a commercially available product), dipentaerythritol hexa(meth)acrylate (KAYARAD DPHA; manufactured by Nippon Kayaku Co., Ltd., and A-DPH-12E; manufactured by Shin-Nakamura Chemical Co., Ltd., as a commercially available product), and structures thereof in which a (meth)acryloyl group is bonded via an ethylene glycol or propylene glycol residue (for example, SR454 and SR499, commercially available from Sartomer Company, Inc.) are preferable. Oligomer types of these can also be used. Further, KAYARAD RP-1040 and DPCA-20 (manufactured by Nippon Kayaku Co., Ltd.) can also be used. In addition, ARONIX M-402, ARONIX TO-1382, and ARONIX TO-2349 (all trade names; all of which are manufactured by Toagosei Co., Ltd.) can also be used.

The tetrafunctional or higher polymerizable monomer $M^2$ may have an acid group such as a carboxyl group, a sulfonic acid group, and a phosphoric acid group. Examples of the commercially available product thereof include ARONIX M-402, ARONIX TO-1382, and ARONIX TO-2349.

The acid value of the polymerizable monomer having an acid group is preferably 0.1 to 40 mgKOH/g, and more preferably 5 to 30 mgKOH/g. In a case where the acid value of the polymerizable monomer is 0.1 mgKOH/g or more, the development and dissolution characteristics of a cured film formed of a photosensitive composition are good, whereas in a case where the acid value is 40 mgKOH/g or less, it is advantageous in terms of production or handling. In addition, the curability is excellent.

In another preferred aspect, the tetrafunctional or higher polymerizable monomer $M^2$ is a compound having a caprolactone structure.

The compound having a caprolactone structure is commercially available as KAYARAD DPCA series from Nippon Kayaku Co., Ltd., and examples thereof include DPCA-20, DPCA-30, DPCA-60, and DPCA-120.

As to the tetrafunctional or higher polymerizable monomer $M^2$, a polymerizable monomer having an alkyleneoxy group can be used. The polymerizable monomer having an alkyleneoxy group is preferably a polymerizable monomer having at least one selected from an ethyleneoxy group and a propyleneoxy group, more preferably a polymerizable monomer having an ethyleneoxy group, and still more preferably a tetrafunctional to hexafunctional (meth)acrylate compound having 4 to 20 ethyleneoxy groups.

Examples of the commercially available product of the polymerizable monomer having an alkyleneoxy group include SR-494 which is a tetrafunctional acrylate having four ethyleneoxy groups, manufactured by Sartomer Co., Inc., a DPCA-60 which is a hexafunctional acrylate having six pentyleneoxy groups.

As the tetrafunctional or higher polymerizable monomer, the urethane acrylates described in JP1973-41708B (JP-S48-41708B), JP1976-37193A (JP-S51-37193A), JP1990-32293B (JP-H02-32293B), and JP1990-16765B (JP-H02-16765B), and the urethane compounds which have an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, it is also preferable to use the addition-polymerizable compounds having an amino structure or a sulfide structure in the molecule, described in JP1988-277653A (JP-S63-277653A), JP1988-260909A (JP-S63-260909A), and JP1989-105238A (JP-H01-105238A).

Examples of commercially available products thereof include urethane oligomers UAS-10 and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, and AI-600 (manufactured by Kyoeisha Chemical Co., Ltd.).

<<Photopolymerization Initiator I>>

The photosensitive composition of the present invention contains a photopolymerization initiator I.

The photopolymerization initiator is not particularly limited as long as it is a compound having an ability of initiating polymerization of the polymerizable monomer M by the action of light, and can be appropriately selected from known photopolymerization initiators. For example, a compound having photosensitivity for light rays in regions from ultraviolet rays to visible light is preferable. Further, the photopolymerization initiator may also be a compound that generates an action with a photoexcited sensitizer to produce active radicals. The photopolymerization initiator I is preferably a compound having photosensitivity to i-rays.

In the present invention, the photopolymerization initiator I includes a photopolymerization initiator $I^1$ having a molar light absorption coefficient at a wavelength of 365 nm of 12,000 L·mol$^{-1}$·cm$^{-1}$ or more. The upper limit of the molar light absorption coefficient at a wavelength of 365 nm of the photopolymerization initiator $I^1$ is preferably 40,000 L·mol$^{-1}$·cm$^{-1}$ or less, more preferably 35,000 L·mol$^{-1}$·cm$^{-1}$ or less, and still more preferably 30,000 L·mol$^{-1}$·cm$^{-1}$ or less.

Moreover, in the present invention, the molar light absorption coefficient at a wavelength of 365 nm of the photopolymerization initiator was calculated by dissolving a photopolymerization initiator in a solvent to prepare a 5%-by-mole solution (measurement solution) of the photopolymerization initiator, and measuring the absorbance of the above-mentioned measurement solution. Specifically, the prepare measurement solution was put into a glass cell having a width of 1 cm to measure an absorbance using a UV-Vis-NIR spectrophotometer (Cary 5000) manufactured by Agilent Technologies, Inc., and the absorbance was applied to the following equation to calculate a molar light absorption coefficient at a wavelength of 365 nm (L·mol$^{-1}$·cm$^{-1}$).

$$\varepsilon = \frac{A}{cl}$$

In the equation, c represents a molar light absorption coefficient (L·mol$^{-1}$·cm$^{-1}$), A represents an absorbance, c represents a concentration (mol/L), and l represents the length (cm) of an optical path.

In the measurement of the molar light absorption coefficient of the photopolymerization initiator, examples of a solvent used for the preparation of a measurement solution include acetonitrile and chloroform. In a case where the photopolymerization initiator is a compound which is dissolved in acetonitrile, the measurement solution is prepared using acetonitrile. In a case where the photopolymerization initiator is a compound which is not dissolved in acetonitrile, but dissolved in chloroform, the measurement solution is prepared using chloroform. Further, in a case where the photopolymerization initiator is a compound which is not dissolved in acetonitrile and chloroform, but dissolved in dimethyl sulfoxide, the measurement solution is prepared using dimethyl sulfoxide.

The photopolymerization initiator $I^1$ may be any one of compound having a molar light absorption coefficient at a wavelength of 365 nm of 12,000 L·mol$^{-1}$·cm$^{-1}$ or more, and examples thereof include an oxime compound. The photopolymerization initiator $I^1$ is preferably at least one selected from an oxime compound having a nitro group and an oxime compound having a naphthalene ring. These compounds have a high molar light absorption coefficient at a wavelength of 365 nm. By incorporation of such compounds, the sensitivity of the photosensitive composition to i-rays is enhanced, and thus, it is easy to form a pattern having good adhesiveness. The naphthalene ring in an oxime compound having a naphthalene ring is preferably fused with another ring to form a ring. Examples of the fused ring including the naphthalene ring include the following structures, and the fused ring is preferably (CB-1). R represents a hydrogen atom or a substituent.

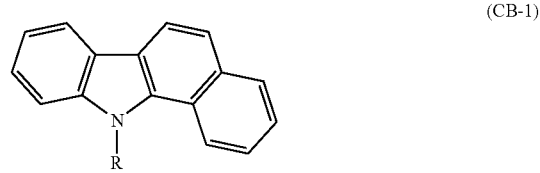

(CB-1)

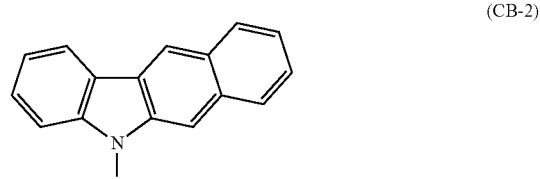

(CB-2)

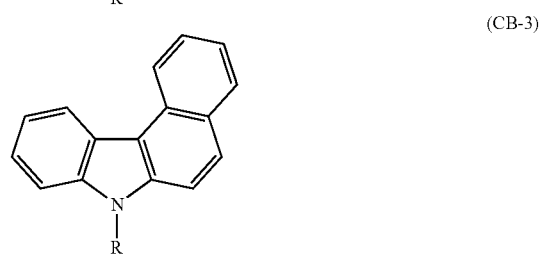

(CB-3)

The photopolymerization initiator $I^1$ is preferably a compound represented by Formula (I-1).

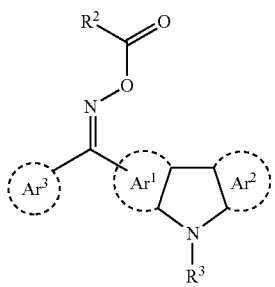

(I-1)

In Formula (I-1), $Ar^1$ and $Ar^2$ each independently represent an aromatic ring, $Ar^3$ represents an aryl group, $R^2$ and $R^3$ each independently represent an alkyl group or an aryl group, and at least one of $Ar^1$ to $Ar^3$, $R^2$, or $R^3$ has a fluorine atom, a group having a fluorine atom, or a nitro group as a substituent.

The aromatic ring represented by $Ar^1$ and $Ar^2$ is preferably an aromatic hydrocarbon ring. The aromatic ring represented by $Ar^1$ and $Ar^2$ may be either a monocycle or a fused ring. The number of carbon atoms of the ring constituting the aromatic ring is preferably 6 to 20, more preferably 6 to 15, and still more preferably 6 to 10. The aromatic ring is particularly preferably a benzene ring or a naphthalene ring. Among those, it is preferable that at least one of $Ar^1$ or $Ar^2$ is a benzene ring, and it is preferable that $Ar^1$ is a benzene ring. $Ar^2$ is preferably a benzene ring or a naphthalene ring.

The aromatic ring represented by $Ar^1$ and $Ar^2$ may have a substituent or may not be unsubstituted. Examples of the substituent include an alkyl group, an aryl group, a heterocyclic group, a nitro group, a cyano group, a halogen atom, —$OR^{X1}$, $SR^{X1}$, —$COR^{X1}$, —$COOR^{X1}$, $OCOR^{X1}$, —$NR^{X1}R^{X2}$, —$NHCOR^{X1}$, —$CONR^{X1}R^{X2}$, —$NHCONR^{X1}R^{X2}$, —$NHCOOR^{X1}$, —$SO_2R^{X1}$, —$SO_2OR^{X1}$, —$NHSO_2R^{X1}$, and —$OR^{X3}$—$OR^{X1}$. $R^{X1}$ and $R^{X2}$ each independently represent a hydrogen atom, an alkyl group, an aryl group, or a heterocyclic group. $R^{X3}$ represents an alkylene group.

Examples of the halogen atom include a fluorine atom, a chlorine atom, a bromine atom, and an iodine atom, with the fluorine atom being preferable.

The number of carbon atoms of the alkyl group as the substituent and the alkyl group represented by $R^{X1}$ and $R^{X2}$ is preferably 1 to 20. The alkyl group may be in any one of linear, branched, and cyclic forms, and is preferably linear or branched. In the alkyl group, some or all of the hydrogen atoms may be substituted with halogen atoms (preferably a fluorine atom). Further, in the alkyl group, some or all of the hydrogen atoms may be substituted with the substituents.

The number of carbon atoms in the aryl group as the substituent or the aryl group represented by $R^{X1}$ and $R^{X2}$ is preferably 6 to 20, more preferably 6 to 15, and still more preferably 6 to 10. The aryl group may be a monocycle or a fused ring. Further, in the aryl group, some or all of the hydrogen atoms may be substituted with the substituents.

The heterocyclic group as the substituent or the heterocyclic group represented by each of $R^{X1}$ and $R^{X2}$ is preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. The heteroatom constituting the heterocyclic group is preferably a nitrogen atom, an oxygen atom, or a sulfur atom. Further, in the heterocyclic group, some or all of the hydrogen atoms may be substituted with the substituents.

The number of carbon atoms of the alkylene group represented by $R^{X3}$ is preferably 1 to 20. The alkylene group may be in any one of linear, branched, and cyclic forms, and is preferably linear or branched.

The number of carbon atoms of the aryl group represented by $Ar^3$ is preferably 6 to 20, more preferably 6 to 15, and particularly preferably 6 to 10. The aryl group represented by $Ar^3$ is preferably a phenyl group or a naphthyl group, and more preferably a phenyl group. The aryl group represented by $Ar^3$ may have a substituent or be unsubstituted. Examples of the substituent include the above-mentioned substituents.

$R^2$ and $R^3$ each independently represent an alkyl group or an aryl group. The number of carbon atoms of the alkyl group is preferably 1 to 20, more preferably 1 to 15, still more preferably 1 to 10, and particularly preferably 1 to 4. The alkyl group may be in any one of linear, branched, and cyclic forms, but is preferably linear or branched. The alkyl group may have a substituent or be unsubstituted. Examples of the substituent include the above-mentioned substituents.

The number of carbon atoms of the aryl group is preferably 6 to 20, more preferably 6 to 15, and still more preferably 6 to 10. The aryl group may have a substituent or be unsubstituted. Examples of the substituent include the above-mentioned substituents.

In Formula (I-1), it is preferable that at least one of $Ar^1$ to $Ar^3$, $R^2$, or $R^3$ has a fluorine atom, a group including a fluorine atom, or a nitro group as a substituent, and at least one of $Ar^1$, . . . , or $Ar^3$ has a fluorine atom, a group including a fluorine atom, or a nitro group as a substituent, and it is more preferable that at least one of $Ar^1$, . . . , or $Ar^3$ has a group including a fluorine atom or a nitro group as a substituent. Further, the nitro group is preferably contained in $Ar^2$. In addition, Further, a fluorine atom and a group including a fluorine atom are preferably contained in $Ar^3$.

The group including a fluorine atom is preferably an alkyl group having a fluorine atom (hereinafter also referred to as a fluorine-containing alkyl group) and a group containing an alkyl group having a fluorine atom (hereinafter also referred to as a fluorine-containing group). As the fluorine-containing group, at least one group selected from —$OR^{X11}$, —$SR^{X11}$, —$COR^{X11}$, —$COOR^{X11}$, —$OCOR^{X11}$, —$NR^{X11}R^{X12}$, —$NHCOR^{X11}$, —$CONR^{X11}R^{X12}$, —$NHCONR^{X11}R^{X12}$, —$NHCOOR^{X11}$, —$SO_2R^{X11}$, —$SO_2R^{X11}$, and —$NHSO_2R^{X11}$ is preferable. $R^{X11}$ represents a fluorine-containing alkyl group, and $R^{x12}$ represents a hydrogen atom, an alkyl group, a fluorine-containing alkyl group, an aryl group, or a heterocyclic group. The fluorine-containing group is more preferably —$OR^{X11}$.

The group including a fluorine atom preferably has a terminal structure represented by Formula (F1) or (F2). * in the formula represents a linking arm.

$$*-CHF_2 \quad (F1)$$

$$*-CF_3 \quad (F2)$$

The number of carbon atoms of the fluorine-containing alkyl group is preferably 1 to 20, more preferably 1 to 15, still more preferably 1 to 10, and particularly preferably 1 to 4. The fluorine-containing alkyl group may be in any one of linear, branched, and cyclic forms, and is preferably linear or branched.

The fluorine-containing alkyl group has a substitution rate of fluorine atoms of preferably 40% to 100%, more preferably 50% to 100%, and still more preferably 60% to 100%. Further, the substitution rate of fluorine atoms in the fluorine-containing alkyl group is a value in percentage showing a ratio (%) of the numbers of the hydrogen atoms of the alkyl group, which are substituted with fluorine atoms.

The alkyl group, the aryl group, and the heterocyclic group represented by $RX^{12}$ have the same definitions as the ranges described for the alkyl group, the aryl group, and the heterocyclic group represented by $R^{X1}$ and $R^{X2}$ as described above.

Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference. In addition, the following compounds are also included.

Specific examples of the oxime compound having a nitro group include the compounds described in paragraph Nos. 0029 to 0037 of JP2010-256891A, the compounds described in paragraph Nos. 0007 to 0033 of JP2010-15025A, the compounds described in paragraph Nos. 0031 to 0047 of JP2013-114249A, the compounds described in paragraph Nos. 0008 to 0012 and 0070 to 0079 of JP2014-137466A, and the compounds described in paragraph Nos. 0007 to 0025 of JP4223071B, and ADEKA ARKLS NCI-831 (manufactured by ADEKA Corporation). In addition, the following compounds are also included.

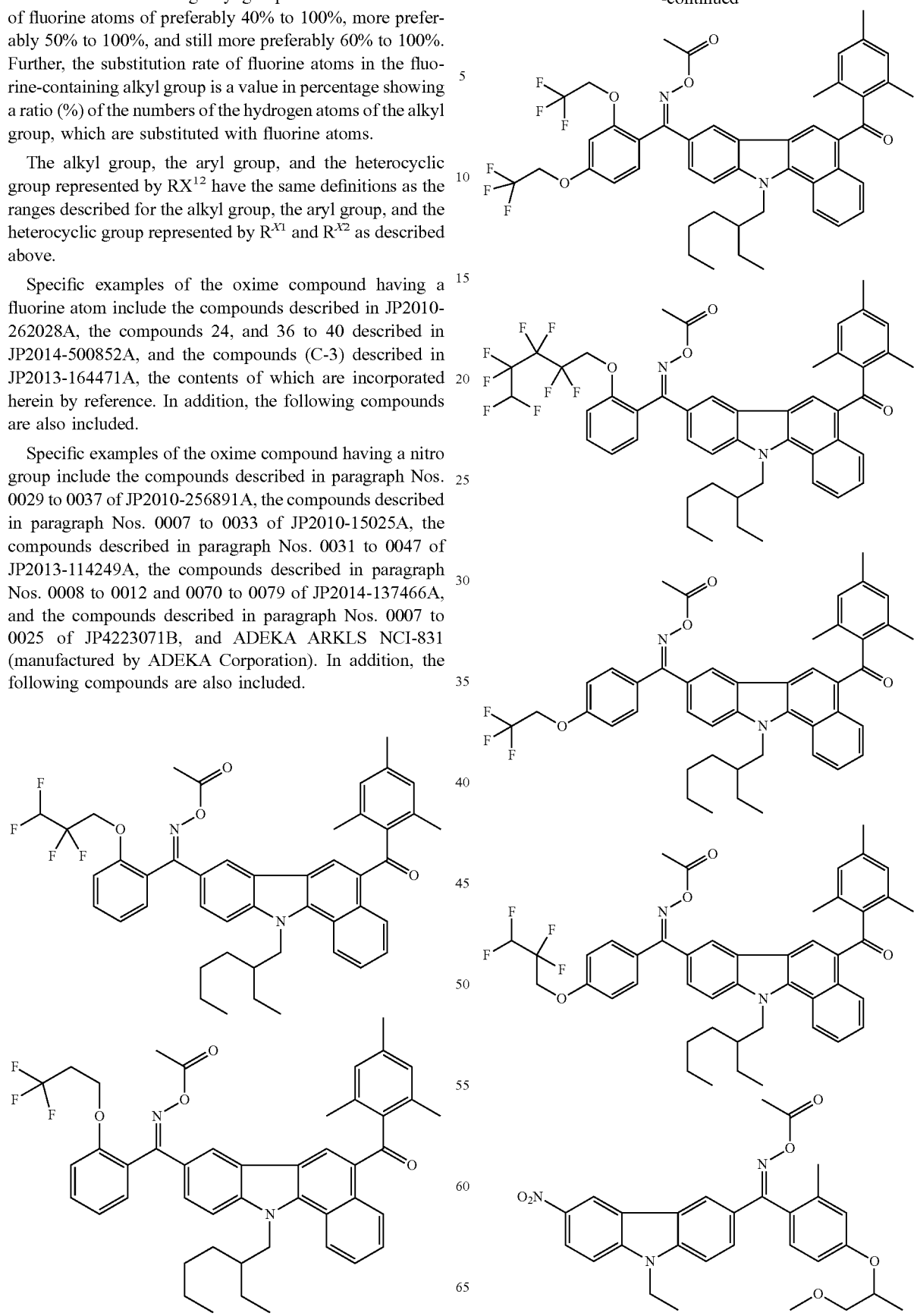

In the present invention, the photopolymerization initiator I may further contain a photopolymerization initiator having a molar light absorption coefficient at a wavelength of 365 nm of less than 12,000 L·mol$^{-1}$·cm$^{-1}$ (hereinafter also referred to as another photopolymerization initiator).

Examples of such another photopolymerization initiator include halogenated hydrocarbon derivatives (for example, those having a triazine skeleton and those having an oxadiazole skeleton), acylphosphine compounds such as acylphosphine oxide, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone.

Moreover, from the viewpoint of exposure sensitivity, as the photopolymerization initiator, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, a hydroxyacetophenone compound, an aminoacetophenone compound and a derivative thereof, a cyclopentadiene-benzene-iron complex and a salt thereof, a halomethyl oxadiazole compound, and a 3-aryl-substituted coumarin compound is preferable.

As such another photopolymerization initiator, a hydroxyacetophenone compound, an aminoacetophenone compound, and an acylphosphine compound can also be suitably used. More specifically, for example, the aminoacetophenone compound described in JP1998-291969A (JP-H10-291969A), and the acylphosphine compound described in JP4225898B can also be used. Further, as the hydroxyacetophenone compound, IRGACURE-184, DAROCUR-1173, IRGACURE-500, IRGACURE-2959, and IRGACURE-127 (trade names, all of which are manufactured by BASF) can be used. As the aminoacetophenone compound, IRGACURE-907, IRGACURE-369, and IRGACURE-379 (trade names: all of which are manufactured by BASF) which are commercially available products can be used. As the aminoacetophenone compound, the compound described in JP2009-191179A can also be used. As the acylphosphine compound, IRGACURE-819 or DAROCUR-TPO (trade names: both manufactured by BASF) can be used.

As such another photopolymerization initiator, an oxime compound is also preferably used. As the specific examples of the oxime compound, the compound described in JP2001-233842A, the compound described in JP2000-80068A, the compound described in JP2006-342166A, and the compound described in JP2016-21012A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-66385A, JP2000-80068A, JP2004-534797A, and JP2006-342166A, or the like can also be used.

As a commercially available product of the oxime compound, IRGACURE-OXE01, IRGACURE-OXE02, IRGACURE-OXE03, and IRGACURE-OXE04 (all of which are manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 and ADEKA OPTOMER N-1919 (all of which are manufactured by ADEKA Corporation, a photopolymerization initiator 2 described in JP2012-14052A) can also be used.

Moreover, as oxime compounds other than the above-described oxime compounds, the compounds described in JP2009-519904A in which oxime is linked to a nitrogen atom of carbazole, the compounds described in U.S. Pat. No. 7,626,957B in which a hetero-substituent is introduced into a benzophenone moiety, the ketoxime compounds described in WO2009/131189A, the compounds described in U.S. Pat. No. 7,556,910B, which contains a triazine skeleton and an oxime skeleton in the same molecule, the compound described in JP2009-221114A, which has a maximum absorption at 405 nm and has excellent sensitivity to a light source of g-rays, and the like may be used. Preferably, reference can be made to the descriptions in, for example, paragraph Nos. 0274 and 0275 of JP2013-29760A, the contents of which are incorporated herein by reference. Specifically, as the oxime compound, a compound represented by General Formula (OX-1) is preferable. In addition, the oxime compound may be an oxime compound in which an N—O bond of oxime forms an (E) isomer, an oxime compound in which the N—O bond of the oxime forms a (Z) isomer, or a mixture in which the N—O bond forms a mixture of the (E) isomer and the (Z) isomer.

(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above-mentioned substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in Formula (OX-1), an alkylene group having 1 to 12 carbon atoms or an alkynylene group is preferable. These groups may have one or more substituents. Examples of the substituent include the above-mentioned substituents.

An oxime compound having a fluorene ring can also be used as such another photopolymerization initiator. Specific examples of the oxime compound having a fluorene ring include the compounds described in JP2014-137466A, the contents of which are incorporated herein by reference.

An oxime compound having a benzofuran skeleton can also be used as such another photopolymerization initiator. Specific examples thereof include OE-01 to OE-75 described in WO2015/036910A.

Specific examples of such another photopolymerization initiator are shown below, but the present invention is not limited thereto.

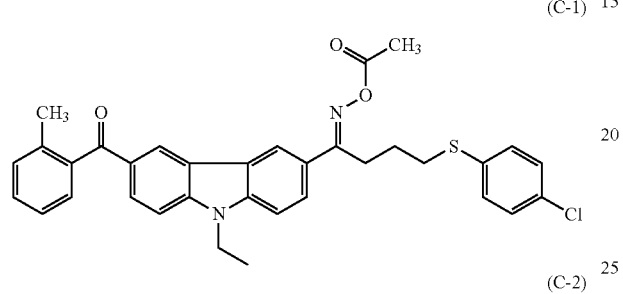

(C-1)

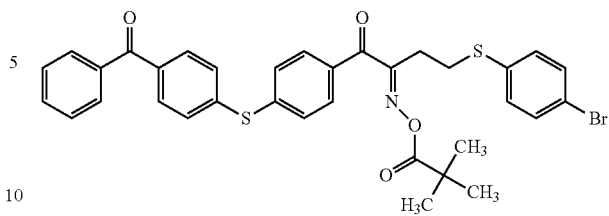

(C-6)

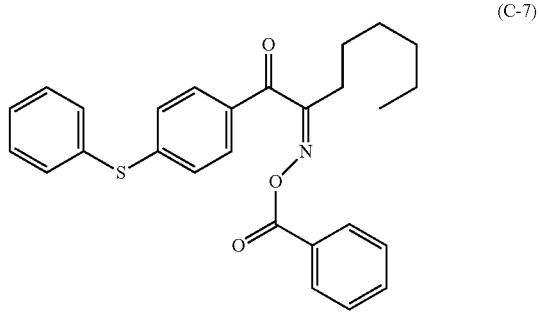

(C-7)

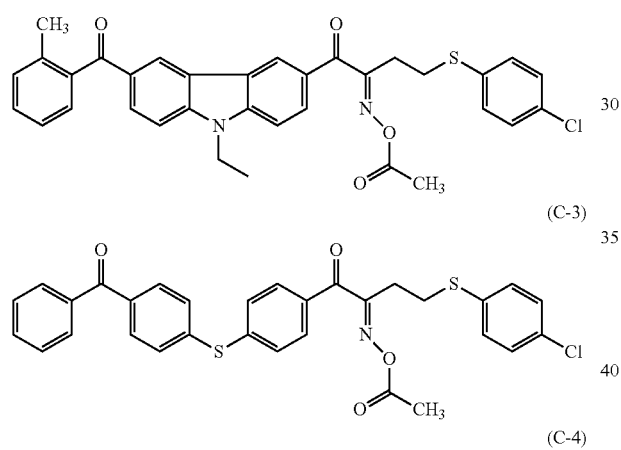

(C-2)

(C-3)

(C-4)

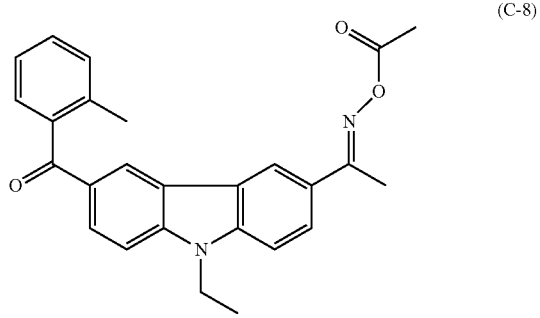

(C-8)

(C-9)

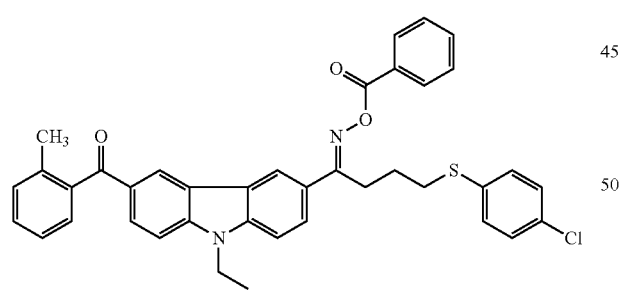

(C-5)

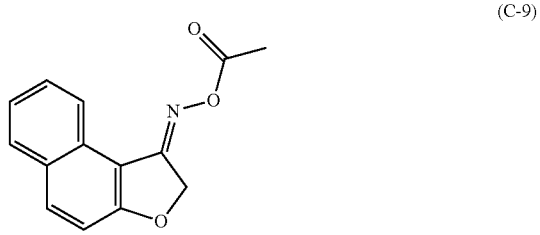

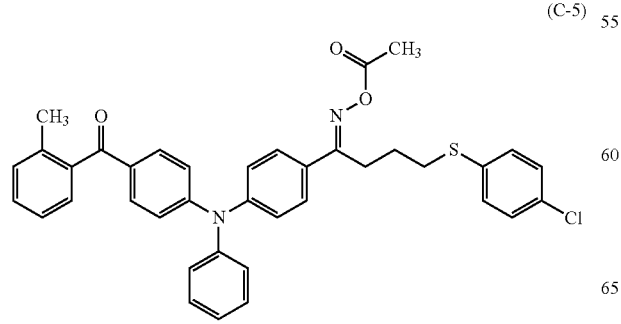

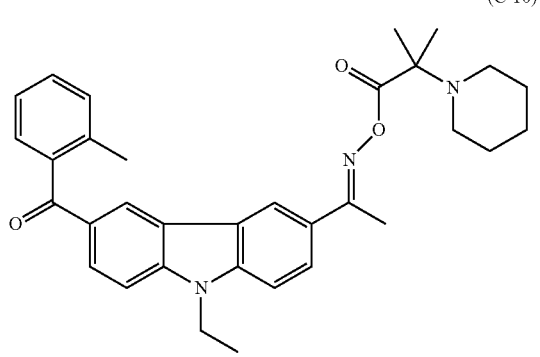

(C-10)

-continued

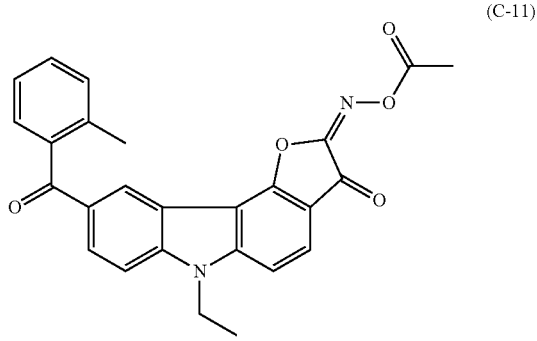

(C-11)

Such another photopolymerization initiator is preferably a compound having a maximum absorption wavelength in a wavelength range of 350 nm to 500 nm, and more preferably a compound having a maximum absorption wavelength in a wavelength range of 360 nm to 480 nm. Further, a compound showing a high absorbance at 365 nm and 405 nm is particularly preferable.

The content of the photopolymerization initiator I is preferably 0.1% to 50% by mass, more preferably 0.5% to 30% by mass, and still more preferably 1% to 20% by mass, with respect to the total solid content of the photosensitive composition. Within this range, better sensitivity and pattern forming properties are obtained. The photosensitive composition of the present invention may include one kind or two or more kinds of the photopolymerization initiators I. In a case where two or more kinds of the photopolymerization initiators I are included, the total amount thereof preferably falls within the range.

In the photopolymerization initiator I, the content of the photopolymerization initiator $I^1$ having a molar light absorption coefficient at a wavelength of 365 nm of 12,000 $L \cdot mol^{-1} \cdot cm^{-1}$ or more is preferably 25% by mass or more, more preferably 30% by mass or more, and still more preferably 50% by mass or more, with respect to the mass of the photopolymerization initiator I. The photopolymerization initiator $I^1$ included in the photopolymerization initiators I may be of one kind or two or more kinds. In a case where two or more kinds of the photopolymerization initiators $I^1$ are included, the total amount thereof preferably falls within the range.

In the present invention, it is also preferable that the photopolymerization initiator I is substantially constituted only with the photopolymerization initiator $I^1$. According to this aspect, it is easy to further accomplish both adhesiveness and pattern forming properties. Further, an expression, "the photopolymerization initiator I is substantially constituted only with the photopolymerization initiator $I^1$" means that the photopolymerization initiator $I^1$ is contained in the content of preferably 99% by mass or more, and more preferably 99.5% by mass or more, with respect to the mass of the photopolymerization initiator I, and still more preferably, the photopolymerization initiator $I^1$ alone is contained.

In the present invention, it is also preferable that the photopolymerization initiator I includes photopolymerization initiators (other photopolymerization initiators) other than the photopolymerization initiator $I^1$ and the photopolymerization initiator $I^1$. According to this aspect, an effect that the residual film rate after development of a cured film formed from the photosensitive composition is enhanced can be expected. In a case where the photopolymerization initiator I includes a photopolymerization initiator other than the photopolymerization initiator $I^1$, the content of such another photopolymerization initiator is preferably 25 to 300 parts by mass, more preferably 50 to 200 parts by mass, and still more preferably 50 to 100 parts by mass, with respect to 100 parts by mass of the photopolymerization initiator $I^1$. By setting the ratio of the photopolymerization initiator $I^1$ to such another photopolymerization initiator to the range, the residual film rate after development of a cured film formed from the photosensitive composition can be further enhanced.

In the present invention, the ratio of the mass of the photopolymerization initiator I to the mass of the polymerizable monomer M (the mass of the photopolymerization initiator I/the mass of the polymerizable monomer M, hereinafter also referred to as I/M) is 0.15 or less, preferably 0.12 or less, and more preferably 0.10 or less. The lower limit is preferably 0.02 or more, and more preferably 0.04 or more. In a case where I/M is set to 0.15 or less, it is possible to further enhance the adhesiveness between a cured film formed from the photosensitive composition and a support or the like while maintaining the excellent pattern forming properties in the cured film.

The ratio of the mass of the photopolymerization initiator I to the mass of the polymerizable monomer $M^1$ having three groups having an ethylenically unsaturated double bond (the mass of the photopolymerization initiator I/the mass of the polymerizable monomer $M^1$, hereinafter also referred to as $I/M^1$) is preferably 0.01 to 0.70, more preferably 0.05 to 0.50, and still more preferably 0.07 to 0.30.

The ratio of the mass of the photopolymerization initiator $I^1$ having a molar light absorption coefficient at a wavelength of 365 nm of 12,000 $L \cdot mol^{-1} \cdot cm^{-1}$ or more to the mass of the polymerizable monomer M (the mass of the photopolymerization initiator $I^1$/the mass of the polymerizable monomer M, hereinafter also referred to as $I^1/M$) is preferably 0.01 to 0.70, more preferably 0.01 to 0.40, and still more preferably 0.02 to 0.30.

The ratio of the mass of the photopolymerization initiator $I^1$ having a molar light absorption coefficient at a wavelength of 365 nm of 12,000 $L \cdot mol^{-1} \cdot cm^{-1}$ or more to the mass of the polymerizable monomer $M^1$ having three groups having an ethylenically unsaturated double bond (the mass of the photopolymerization initiator $I^1$/the mass of the polymerizable monomer $M^1$, hereinafter also referred to as $I^1/M^1$) is preferably 0.01 to 0.40, more preferably 0.01 to 0.30, and still more preferably 0.02 to 0.20.

<<Compound Having Epoxy Group>>

The photosensitive composition of the present invention can include a compound having an epoxy group (hereinafter also referred to as an epoxy compound). Examples of the epoxy compound include a compound having one or more epoxy groups per molecule, and the epoxy compound is preferably a compound having two or more epoxy groups per molecule. The number of epoxy groups per molecule of the epoxy compound is preferably 1 to 100. The lower limit is more preferably 2 or more. The upper limit can be set to, for example, 10 or less, or to 5 or less.

In the present invention, The epoxy compound is preferably a compound having at least one selected from an aromatic ring and an aliphatic ring, and more preferably a compound having an aliphatic ring. The epoxy group is preferably bonded to an aromatic ring and an aliphatic ring via a single bond or a linking group. Examples of the linking group include an alkylene group, an arylene group, —O—, —NR'— (R' represents a hydrogen atom, an alkyl group which may have a substituent, or an aryl group which may have a substituent, with the hydrogen atom being preferable), —SO$_2$—, —CO—, —O—, —S—, and a group formed by combination thereof. In a case where the epoxy compound is a compound having an aliphatic ring, it is preferably a compound in which an epoxy group is bonded to an aliphatic ring via a direct bond (a bond through a single bond). In a case where the epoxy compound is a compound having an aromatic ring, it is preferably a compound in which an epoxy group is bonded to an aromatic ring via a linking group. The linking group is preferably an alkylene group, or a group formed by combination of an alkylene group with —O—. In addition, a compound having a structure in which 2 or more aromatic rings are linked to a hydrocarbon group can also be used as the epoxy compound. The hydrocarbon group is preferably an alkylene group having 1 to 6 carbon atoms. The epoxy group is preferably linked via the linking group.

The epoxy equivalent (=the molecular weight of the epoxy compound/the number of epoxy groups) of the epoxy compound is preferably 500 g/equivalent or less, more preferably 100 to 400 g/equivalent, and still more preferably 100 to 300 g/equivalent.

The epoxy compound may be either a low-molecular-weight compound (for example, a molecular weight of less than 1,000) or a polymer compound (macromolecule) (for example, a molecular weight of 1,000 or more, and in a case of a polymer, a weight-average molecular weight of 1,000 or more). The weight-average molecular weight of the epoxy compound is preferably 200 to 100,000, and more preferably 500 to 50,000. The upper limit of the weight-average molecular weight is more preferably 10,000 or less, still more preferably 5,000 or less, and even still more preferably 3,000 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference. Examples of commercially available products thereof are as follows. Examples of a bisphenol A type epoxy resin include jER825, jER827, jER828, jER834, jER1001, jER1002, jER1003, jER1055, jER1007, jER1009, and jER1010 (all of which are manufactured by Mitsubishi Chemical Corporation), EPICLON860, EPICLON1050, EPICLON1051, and EPICLON1055 (all of which are manufactured by DIC Corporation). Examples of a bisphenol F type epoxy resin include jER806, jER807, jER4004, jER4005, jER4007, and jER4010 (all of which are manufactured by Mitsubishi Chemical Corporation), EPICLON830 and EPICLON835 (both of which are manufactured by DIC Corporation), LCE-21 and RE-602S (both of which are manufactured by Nippon Kayaku Co., Ltd.). Examples of a phenol novolac type epoxy resin include jER152, jER154, jER157S70, and jER157S65 (all of which are manufactured by Mitsubishi Chemical Corporation), EPICLON N-740, EPICLON N-770, and EPICLON N-775 (all of which are manufactured by DIC Corporation). Examples of a cresol novolac type epoxy resin include EPICLON N-660, EPICLON N-665, EPICLON N-670, EPICLON N-673, EPICLON N-680, EPICLON N-690, and EPICLON N-695 (all of which are manufactured by DIC Corporation), and EOCN-1020 (all of which are manufactured by Nippon Kayaku Co., Ltd.). Examples of an aliphatic epoxy resin include ADEKA RESIN EP-40805, ADEKA RESIN EP-40855, and ADEKA RESIN EP-40885 (all of which are manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all of which are manufactured by Daicel Chemical Industries, Ltd.), and DENACOL EX-212L, EX-214L, EX-216L, EX-321L, and EX-850L (all of which are manufactured by Nagase ChemteX Corporation). In addition, other examples of the commercially available products thereof include ADEKA RESIN EP-40005, EP-40035, EP-40105, EP-40115, NC-2000, NC-3000, NC-7300, XD-1000, EPPN-501, and EPPN-502 (all of which are manufactured by ADEKA Corporation), and jER1031S (manufactured by Mitsubishi Chemical Corporation).

Moreover, a compound represented by Formula (EP1) can also be used as the epoxy compound.

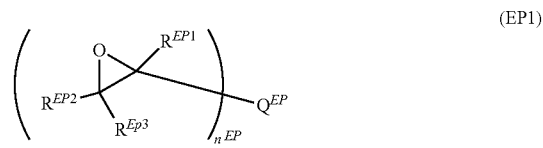

(EP1)

In Formula (EP1), $R^{EP1}$ to $R^{EP3}$ each independently represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a ring. $Q^{EP}$ represents a single bond or an $n^{EP}$-valent organic group. $R^{EP1}$ to $R^{EP3}$ may also be bonded to $Q^{EP}$ to form a ring. $n^{EP}$ represents an integer of 1 or more, preferably 2 to 10, and more preferably 2 to 6, provided that in a case where $Q^{EP}$ is a single bond, $n^{EP}$ is 2.

With reference to the details of $R^{EP1}$ to $R^{EP3}$, or $Q^{EP}$, reference can be made to the description in paragraph Nos. 0087 to 0088 of JP2014-089408A, the contents of which are incorporated herein by reference. Specific examples of the compound represented by Formula (EP1) include glycidyl trityl ether. Other examples thereof include the compounds described in paragraph No. 0090 of JP2014-089408A, the contents of which are incorporated herein by reference.

The content of the epoxy compound is preferably 0.1% to 40% by mass with respect to the total solid content of the photosensitive composition. The lower limit is, for example, more preferably 0.5% by mass or more, and still more preferably 1% by mass or more. The upper limit is, for example, more preferably 30% by mass or less, and still more preferably 20% by mass or less. The epoxy compounds may be used singly or in combination of two or more kinds thereof. In a case where two or more kinds of the epoxy compounds are used in combination, the total amount thereof preferably falls within the range.

It is also preferable that the photosensitive composition of the present invention does not substantially contain an epoxy compound. An expression, "not substantially containing an epoxy compound" means that the content of the epoxy compound is preferably 0.05% by mass or less, and more preferably 0.01% by mass or less, with respect to the total solid content of the photosensitive composition, and still more preferably, the epoxy compound is not contained.

<<Resin>>

The photosensitive composition of the present invention preferably includes a resin. The resin is blended in applications, such as an application for dispersing a pigment in the composition or an application as a binder. Incidentally, a resin which is usually used for dispersing a colorant such as a pigment is also referred to as a dispersant. However, such uses of the resin are only exemplary, and the resin can also be used for other purposes, in addition to the above-mentioned uses.

The content of the resin in the photosensitive composition of the present invention is preferably 1% to 80% by mass with respect to the total solid content of the photosensitive composition. The lower limit is more preferably 5% by mass or more, and still more preferably 10% by mass or more. The upper limit is more preferably 70% by mass or less, and still more preferably 60% by mass or less.

<<<Dispersant>>>

The photosensitive composition of the present invention preferably includes a dispersant as the resin. In particular, in a case of a pigment is used, it is preferable that the dispersant is included. Examples of the dispersant include an acidic dispersant (acidic resin) and a basic dispersant (basic resin).

It is preferable that the dispersant includes at least an acidic dispersant, and it is more preferable that the dispersant includes an acidic dispersant alone. By making the dispersant include at least the acidic dispersant, the dispersibility of the pigment is improved and the brightness unevenness of a cured film formed from the photosensitive resin is hardly generated. Further, since excellent developability is obtained in the cured film, pattern formation can be suitably formed by photolithography. In addition, an expression, "the dispersant includes an acidic dispersant alone" means, for example, that the content of the acidic dispersant in the total mass of the dispersant is preferably 99% by mass or more, and can be 99.9% by mass or more.

Here, the acidic dispersant (acidic resin) indicates a resin in which the amount of acid groups is more than that of basic groups. As the acidic dispersant (acidic resin), a resin in which the amount of the acid groups is 70% by mole or more with respect to 100% by mole of the total amount of the acid groups and the basic groups is preferable, and a resin which is only substantially composed of acid groups is more preferable. The acid group contained in the acidic dispersant (acidic resin) is preferably a carboxyl group. The acid value of the acidic dispersant (acidic resin) is preferably 5 to 105 mgKOH/g.

Furthermore, the basic dispersant (basic resin) indicates resin in which the amount of acid groups is more than that of basic groups. As the basic dispersant (basic resin), a resin in which the amount of the basic groups is more than 50% by mole with respect to 100% by mole of the total amount of the acid groups and the basic groups is preferable. The basic group contained in the basic dispersant is preferably an amino group.

Examples of the dispersant include polymer dispersants [for example, a polyamidoamine and a salt thereof, a polycarboxylic acid and a salt thereof, an unsaturated high-molecular-weight acid ester, a modified polyurethane, a modified polyester, a modified poly (meth)acrylate, a (meth)acrylic copolymer, and a naphthalenesulfonic acid/formalin condensate], a polyoxyethylene alkyl phosphate ester, a polyoxyethylene alkylamine, and an alkanolamine.

The polymer dispersant can further be classified into a linear polymer, a terminal-modified polymer, a graft-type polymer, and a block-type polymer, depending on its structure. The polymer dispersant is adsorbed on a surface of a pigment and acts so as to prevent re-aggregation. For this reason, examples of a preferred structure thereof include a terminal-modified polymer, a graft-type polymer, and a block-type polymer, which have an anchoring site on a surface of a pigment. In addition, the dispersants described in paragraph Nos. 0028 to 0124 of JP2011-070156A, or the dispersants described in JP2007-277514A are also preferably used, and the contents of the publications are incorporated herein by reference.

As the dispersant, a resin represented by Formula (D) is preferably used.

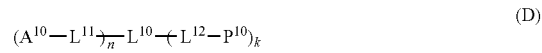

In Formula (D), $L^{10}$ represents an (n+k)-valent linking group, $L^{11}$ and $L^{12}$ each independently represent a single bond or a divalent linking group, $A^{10}$ represents a monovalent organic group containing at least one structure or moiety selected from a colorant structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; n $A^{10}$'s and n $L^{11}$'s may be each independently the same as or different from each other. k $L^{12}$'s and k $P^{10}$'s may be the same as or different from each other. k represents 1 to 8, n represents 2 to 9, and k+n satisfies 3 to 10. $P^{10}$ represents a monovalent polymer chain having a repeating unit.

With regard to the details of $L^{10}$ to $L^{12}$, $P^{10}$, and $A^{10}$, reference can be made to the description in paragraph Nos. 0041 to 0098 of JP2007-277514A, the contents of which are incorporated herein by reference. Specific examples of the resin represented by Formula (D) include the resins described in paragraph Nos. 0327 to 0347 of JP2007-277514A, the contents of which are incorporated herein by reference.

As the resin (dispersant), a graft copolymer including a repeating unit represented by any one of Formulae (1) to (4) can also be used.

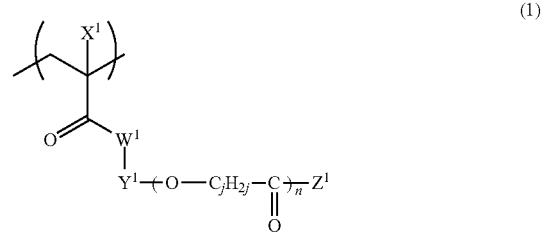

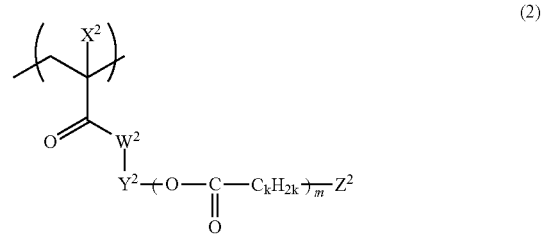

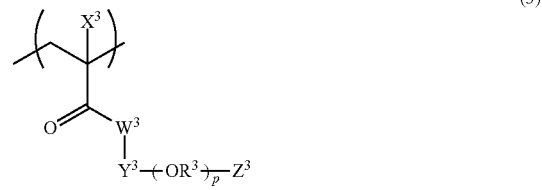

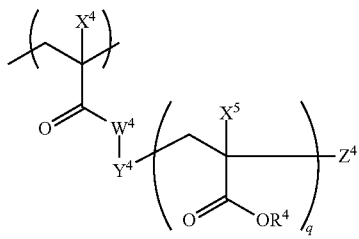

(4)

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$, and $W^4$ are each preferably an oxygen atom. $X^1$, $X^2$, $X^3$, $X^4$, and $X^5$ are each preferably a hydrogen atom or an alkyl group having 1 to 12 carbon atoms, and are each independently more preferably a hydrogen atom or a methyl group, and particularly preferably methyl groups. $Y^1$, $Y^2$, $Y^3$, and $Y^4$ each independently represent a divalent linking group, and the linking group is not particularly limited in their structures. The structure of the monovalent group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the monovalent groups represented by $Z^1$, $Z^2$, $Z^3$, and $Z^4$, in particular from the viewpoint of improving the dispersibility. It is particularly preferable that $Z^1$, $Z^2$, $Z^3$, and $Z^4$ each independently represent an alkyl group or an alkoxy group having 5 to 24 carbon atoms, and among these, a branched alkyl group having 5 to 24 carbon atoms, a cyclic alkyl group having 5 to 24 carbon atoms, or an alkoxy group having 5 to 24 carbon atoms is more preferable. In addition, the alkyl group contained in the alkoxy group may be in any one of linear, branched, and cyclic forms.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is particularly preferable. In Formula (4), in a case where q is 2 to 500, $X^5$'s and $R^4$'s which are present in plural numbers in a graft copolymer may be the same as or different from each other.

With regard to details of the graft copolymer, reference can be made to the description in paragraph Nos. 0025 to 0094 of JP2012-255128A, the contents of which are incorporated herein by reference. Specific examples of the graft copolymer include the resins described in paragraph Nos. 0072 to 0094 of JP2012-255128A, the contents of which are incorporated herein by reference.

Furthermore, as the resin (dispersant), an oligoimine-based dispersant having a nitrogen atom in at least one of the main chain or a side chain can be used. As the oligoimine-based dispersant, a resin having a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

With regard to the oligoimine-based dispersant, reference can be made to the description in paragraph Nos. 0102 to 0174 of JP2012-255128A, the contents of which are incorporated herein by reference. As specific examples of the oligoimine-based dispersant, the resins described in paragraph Nos. 0168 to 0174 of JP2012-255128A can be used.

The dispersant is also available as a commercially available product, and specific examples thereof include "DA-7301" manufactured by Kusumoto Chemicals, Ltd., "Disperbyk-101 (polyamidamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers)", and "BYK-P104 and P105 (unsaturated high-molecular-weight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalenesulfonic acid/formalin polycondensate), MS, C, and SN-B (aromatic sulfonic acid/formalin polycondensate), HOMOGENOL L-18 (polymeric polycarboxylic acid), EMULGEN 920, 930, 935, and 985 (polyoxyethylene nonyl phenyl ether), and ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft-type polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" manufactured by Kawaken Fine Chemicals Co., Ltd., "Organosiloxane Polymer KP341" manufactured by Shin-Etsu Chemical Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA Corporation, and "IONET S-20" manufactured by Sanyo Chemical Industries, Ltd.

In addition, the resins described in the section for the dispersant can also be used in applications other than those as dispersants. For example, the resins can also be used as a binder.

<<<Alkali-Soluble Resin>>>

The photosensitive composition of the present invention preferably contains an alkali-soluble resin as the resin. In addition, the alkali-soluble resin can also be used as a dispersant or a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin can be appropriately selected from resins having a group enhancing alkali solubility. Examples of the group enhancing alkali solubility (hereinafter also referred to as an acid group) include a carboxyl group, a phosphoric acid group, a sulfo group, and a phenolic hydroxyl group, with the carboxyl group being preferable. The alkali-soluble resin may have one kind or two or more kinds of the acid groups.

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable. Further, from the viewpoint of controlling developability, an acrylic resin, an acrylamide-based resin, and an acryl/acrylamide copolymer resin are preferable.

As the alkali-soluble resin, polymers having a carboxyl group in a side chain are preferable. Examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of one kind or of two or more kinds thereof.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can also be preferably used. Further, those obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. In addition, as a commercially available product thereof, for example, FF-426 (manufactured by Fujikura Kasei Co., Ltd.) or the like can also be used.

As the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group on a side chain thereof, and the like are useful.

Examples of commercially available products of the alkali-soluble resin having a polymerizable group include DIANAL NR Series (manufactured by Mitsubishi Rayon Co., Ltd.), PHOTOMER 6173 (COOH-containing polyurethane acrylic oligomer, manufactured by Diamond Shamrock Co., Ltd.), VISCOAT R-264 and KS RESIST 106 (both of which are manufactured by Osaka Organic Chemical Industry, Ltd.), CYCLOMER P Series (for example, ACA230AA) and PLACCEL CF200 Series (both of which are manufactured by Daicel Corporation), EBECRYL 3800 (manufactured by Daicel-UCB Co., Ltd.), ACRYCURE RD-F8 (manufactured by Nippon Shokubai Co., Ltd.), and DP-1305 (manufactured by FUJI FINE CHEMICAL CO., LTD.).

It is also preferable that the alkali-soluble resin includes a polymer obtained by polymerizing monomer components including at least one compound selected from a compound represented by Formula (ED1) and the compound represented by Formula (1) of JP2010-168539A (these compounds are hereinafter also referred to as an "ether dimer" in some cases).

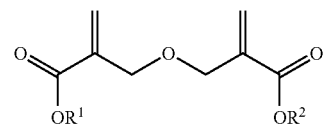

(ED1)

In Formula (ED1), $R^1$ and $R^2$ each independently represent a hydrogen atom or a hydrocarbon group having 1 to 25 carbon atoms, which may have a substituent.

With regard to specific examples of the ether dimer, reference can be made to paragraph No. 0317 of JP2013-29760A, the contents of which are incorporated herein by reference. These ether dimers may be of one kind or of two or more kinds.

Example of the polymer formed by polymerizing monomer components including ether dimers include the following structures.

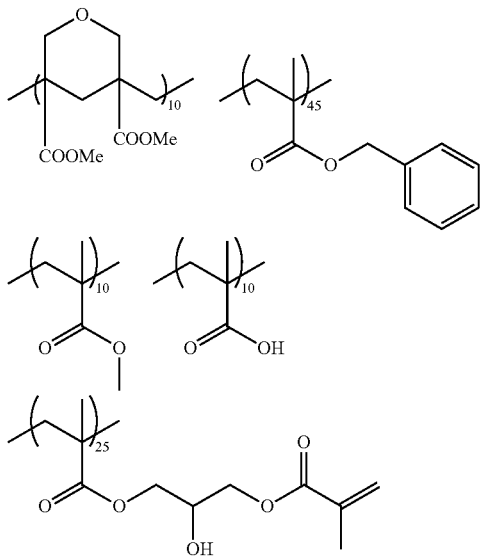

The alkali-soluble resin may include a repeating unit derived from a compound represented by Formula (X).

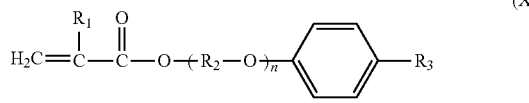

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms in the alkylene group of $R_2$ is preferably 2 or 3. Further, the number of carbon atoms in the alkyl group of $R_3$ is 1 to 20, and more preferably 1 to 10, and the alkyl group of $R_3$ may include a benzene ring. Examples of the alkyl group including a benzene ring, represented by $R_3$, include a benzyl group and a 2-phenyl(iso)propyl group.

With regard to the alkali-soluble resin, reference can be made to the description in paragraph Nos. 0558 to 0571 of JP2012-208494A (paragraph Nos. 0685 to 0700 of the corresponding US2012/0235099A), the contents of which are incorporated herein by reference. In addition, the copolymers (B) described in paragraph Nos. 0029 to 0063 of JP2012-32767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-137531A and the binder resins used in Examples of the document, the binder resins described in paragraph Nos. 0132 to 0143 of JP2013-024934A and Examples of the document, the binder resins described in paragraph Nos. 0092 to 0098 of JP2011-242752A and the binder resins used in Examples of the document, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, even still more preferably 150 mgKOH/g or less, and further still more preferably 120 mgKOH/g or less.

The content of the alkali-soluble resin is preferably 1% to 80% by mass with respect to the total solid content of the photosensitive composition. The lower limit is more preferably 2% by mass or more, and still more preferably 3% by mass or more. The upper limit is more preferably 70% by mass or less, and still more preferably 60% by mass or less. The photosensitive composition of the present invention may include one kind or two or more kinds of the alkali-soluble resins. In a case where two or more kinds of the alkali-soluble resins are included, the total amount thereof preferably falls within the range.

<<Solvent>>

It is preferable that the photosensitive composition of the present invention contains a solvent. The solvent is preferably an organic solvent. The organic solvent is not particularly limited as long as it satisfies the solubility of the respective components or the coatability of the photosensitive composition.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate (1-methoxy-2-propyl acetate), propylene glycol monoethyl ether acetate, propylene glycol monopropyl ether acetate, and 2-methoxy-1-propyl acetate; ketones, for example, methyl ethyl ketone, cyclohexanone, cyclopentanone, 2-heptanone, and 3-heptanone; and aromatic hydrocarbons, for example, toluene and xylene.

However, it is preferable in some cases to reduce aromatic hydrocarbons (benzene, toluene, xylene, ethylbenzene, and the like) (for example, the amount can be set to 50 parts per million (ppm) by mass or less, 10 ppm by mass or less, or 1 ppm by mass or less with respect to the total amount of the organic solvent) as a solvent for a reason such as an environmental aspect.

The solvents may be used singly or in combination of two or more kinds thereof. In a case where the solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol monomethyl ether acetate (1-methoxy-2-propyl acetate), and 2-methoxy-1-propyl acetate.

In the present invention, the solvent preferably includes 2-methoxy-1-propyl acetate. The content of 2-methoxy-1-propyl acetate is preferably 0.001% to 5% by mass with respect to the mass of the photosensitive composition. The upper limit is more preferably 3% by mass or less, and still more preferably 2% by mass or less.

Furthermore, the content of 2-methoxy-1-propyl acetate is preferably 0.01% to 0.5% by mass with respect to the mass of the solvent. The lower limit is more preferably 0.05% by mass or more, and still more preferably 0.1% by mass or more. The upper limit is more preferably 0.4% by mass or less, and still more preferably 0.2% by mass or less.

In the present invention, the organic solvent preferably has a content of peroxides of 0.8 mmol/L or less, and more preferably, it does not substantially include peroxides. Further, it is preferable to use an organic solvent having a small metal content, and for example, the metal content of the organic solvent is preferably 10 parts per billion (ppb) by mass or less. As desired, the organic solvent having a metal content at a level of parts per trillion (ppt) by mass may be used, and such a high-purity solvent is provided by, for example, Toyo Kasei Kogyo Co., Ltd. (The Chemical Daily, Nov. 13, 2015).

The content of the solvent is preferably an amount such that the total solid content of the photosensitive composition is 5% to 80% by mass. The lower limit is more preferably 10% by mass or more. The upper limit is more preferably 60% by mass or less, still more preferably 50% by mass or less, and even still more preferably 40% by mass or less.

<<Curing Accelerator>>

A curing accelerator may be added to the photosensitive composition of the present invention. Examples of the curing accelerator include an aromatic amine compound and a thiol compound.

(Aromatic Amine Compound)

In a case where the photosensitive composition of the present invention includes an epoxy compound, it is preferable that the photosensitive composition includes an aromatic amine compound. According to this aspect, good curability is easily obtained. The aromatic amine compound may be a monofunctional aromatic amine compound having one amino group, or polyfunctional aromatic amine compound having two or more amino groups. The aromatic amine compound is preferably a compound represented by Formula (Am-1) or Formula (Am-2), and more preferably a compound represented by Formula (Am-2).

(Am-1)

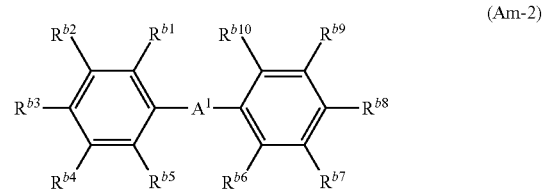

(Am-2)

In Formula (Am-1) $R^{a1}$ to $R^{a6}$ each independently represent a hydrogen atom or a substituent, and at least one of $R^{a1}, \ldots,$ or $R^{a6}$ represents $-NR^{100}R^{101}$ or a group having $-NR^{100}R^{101}$. $R^{100}$ and $R^{101}$ each independently represent a hydrogen atom or a substituent. Two adjacent groups of $R^{a1}$ to $R^{a6}$ may be bonded to each other to form a ring.

In Formula (Am-2), $R^{b1}$ to $R^{b10}$ each independently represent a hydrogen atom or a substituent, at least one of $R^{b1}, \ldots,$ or $R^{b10}$ represents $-NR^{100}R^{101}$ or a group having $-NR^{100}R^{101}$. Two adjacent groups of $R^{b1}$ to $R^{b10}$ may be bonded to each other to form a ring. $A^1$ represents a single bond or a divalent linking group. $R^{100}$ and $R^{101}$ each independently represent a hydrogen atom or a substituent.

Examples of the substituent represented by each of $R^{100}$ and $R^{101}$ include an alkyl group, an aryl group, and a heterocyclic group, with the alkyl group being preferable. The number of carbon atoms of the alkyl group is preferably 1 to 10, more preferably 1 to 5, and still more preferably 1 to 3. The alkyl group is preferably linear or branched, and more preferably linear.

Examples of the substituent represented by each of $R^{a1}$ to $R^{a6}$, and $R^{b1}$ to $R^{b10}$ include an alkyl group and a nitro group.

Examples of the divalent linking group represented by $A^1$ include an alkylene group, $-O-$, $-CO-$, $-OCO-$, $-COO-$, $-SO_2-$, $-SO-$, $-S-$, and a group formed by a combination thereof. The number of carbon atoms of the alkylene group is preferably 1 to 10, and more preferably 1 to 5. The alkylene group is preferably linear or branched. The alkylene group may be unsubstituted or may have a substituent. Examples of the substituent include a halogen atom.

Specific examples of the aromatic amine compound include aniline, N,N-dimethyl aniline, N-ethyl-N-methyl-aniline, N,N-diethylaniline, 4-nitroaniline, N,N-dimethyl-4-nitroaniline, 4,4'-diaminobiphenyl, 3,5-bistrifluoromethyl-1,2-diaminobenzene, 2,2-bis(4-aminophenyl) hexafluoropropane, 2,3-bis(4-aminophenyl) succinonitrile, 4,4'-diaminobenzophenone, 4,4'-diaminophenylbenzoate, 4,4'-diaminodiphenylsulfone, 1,4-diamino-2-chlorobenzene, 1,4-diamino-2-bromobenzene, 1,4-diamino-2-iodobenzene, 1,4-diamino-2-nitrobenzene, 1,4-diamino-2-trifluoromethylbenzene, 2,5-diaminobenzonitrile, 2,5-diaminoacetophenone, 2,5-diaminobenzoic acid, 2,2'-dichlorobenzidine, 2,2'-dibromobenzidine, 2,2'-diiodobenzidine, 2,2'-dinitrobenzidine, 2,2'-bis(trifluoromethyl)benzidine, ethyl 3-aminobenzenesulfonate, N,N-dimethylbenzylamine, triphenylamine, trinaphthylamine, N-phenyl-N-methylaniline, N,N-dimethyl-p-toluidine, N,N-dimethyl-4-bromoaniline, and N,N-dimethyl-4-methoxyaniline.

(Thiol Compound)

Examples of the thiol compound include a polyfunctional thiol compound having two or more mercapto groups in a molecule thereof. The polyfunctional thiol compounds may also be added for the purpose of improving stability, odor, resolution, developability, adhesiveness, or the like. The polyfunctional thiol compounds are preferably secondary alkanethiols, and particularly preferably a compound having a structure represented by Formula (T1).

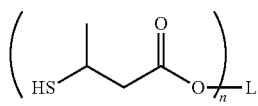

Formula (T1)

(In Formula (T1), n represents an integer of 2 to 4, and L represents a divalent to tetravalent linking group.)

In Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compounds are compounds represented by Structural Formulae (T2) to (T4), with the compound represented by Formula (T2) being particularly preferable. The thiol compounds can be used singly or in combination of a plurality of kinds thereof.

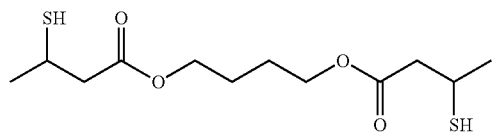

(T2)

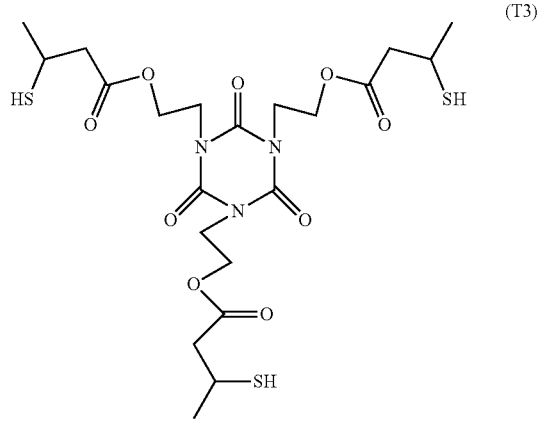

(T3)

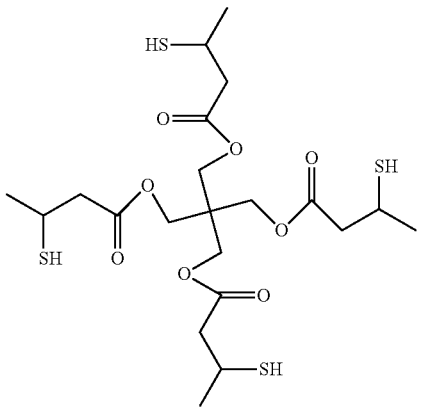

(T4)

Moreover, as the curing accelerator, a methylol-based compound (for example, the compounds exemplified as a crosslinking agent in paragraph No. 0246 of JP2015-34963A), amines, phosphonium salts, amidine salts, amide compounds (each of which are the curing agents described in, for example, paragraph No. 0186 of JP2013-41165A), base generators (for example, the ionic compounds described in JP2014-55114A), cyanate compounds (for example, the compounds described in paragraph No. 0071 of JP2012-150180A), alkoxysilane compounds (for example, the alkoxysilane compounds having epoxy groups, described in JP2011-253054A), onium salt compounds (for example, the compounds exemplified as an acid generator in paragraph No. 0216 of JP2015-34963A, and the compounds described in JP2009-180949A), or the like can also be used.

In a case where the photosensitive composition of the present invention contains the curing accelerator, the content of the curing accelerator is preferably 0.3% to 8.9% by mass, and more preferably 0.8% to 6.4% by mass, with respect to the total solid content of the photosensitive composition.

Furthermore, the content of the aromatic amine compound is preferably 2 to 6 parts by mass, and more preferably 1 to 10 parts by mass, with respect to 100 parts by mass of the epoxy compound. According to this aspect, good curability is easily obtained.

<<Pigment Derivative>>

The photosensitive composition of the present invention preferably contains a pigment derivative. The pigment derivative is preferably a compound having a structure in which a portion of an organic pigment is substituted with an acidic group, a basic group, or a phthalimidomethyl group. As the pigment derivative, a pigment derivative having an acidic group or a basic group is preferable from the viewpoint of dispersibility and dispersion stability.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment. In addition, the acidic group contained in the pigment derivative is preferably a sulfo group, a carboxyl group, or a quaternary ammonium base group thereof, more preferably a carboxyl group or a sulfo group, and particularly preferably a sulfo group. The basic group contained in the pigment derivative is preferably an amino group, and particularly preferably a tertiary amino group. With regard to the specific examples of the pigment derivative, reference can be made to the description in paragraphs 0162 to 0183 of JP2011-252065A, the contents of which are incorporated herein by reference.

In a case where the photosensitive composition of the present invention contains the pigment derivative, the content of the pigment derivative is preferably 1% to 30% by mass, and more preferably 3% to 20% by mass, with respect to the mass of the pigment. The pigment derivative may be used singly or in combination of two or more kinds thereof.

<<Surfactant>>

From the viewpoint of further improving coatability, the photosensitive composition of the present invention may contain various surfactants. As the surfactant, various surfactants such as a fluorine-based surfactant, a nonionic surfactant, a cationic surfactant, an anionic surfactant, and a silicon-based surfactant can be used.

By incorporating a fluorine-based surfactant into the photosensitive composition of the present invention, liquid characteristics (in particular, fluidity) in a case of preparation of a coating liquid using the photosensitive composition are further improved, and thus, the evenness of coating thickness or liquid saving properties can be further improved. That is, in a case where a film is formed using the coating liquid to which a photosensitive composition containing a fluorine-based surfactant has been applied, the interface tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the like, and the solubility of the surfactant in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and RS-72-K (all of which are manufactured by DIC Corporation), FLUORAD FC430, FC431, and FC171 (all of which are manufactured by Sumitomo 3M), SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (all of which are manufactured by ASAHI GLASS Co., Ltd.), and PF636, PF656, PF6320, PF6520, and PF7002 (all of which are manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used. As the fluorine-based surfactant, a block polymer can also be used, and specific examples thereof include the compounds described in JP2011-89090A.

In addition, as the fluorine-based surfactant, an acrylic compound in which by application of heat to a molecular structure containing a functional group having a fluorine atom, in which the functional group having a fluorine atom is cut to volatilize a fluorine atom, can also be preferably used. Examples of the fluorine-based surfactant include MEGAFACE DS series (manufactured by DIC Corporation, The Chemical Daily, Feb. 22, 2016, Nikkei Business Daily, Feb. 23, 2016), for example, MEGAFACE DS-21.

The fluorine-based surfactant can also preferably use a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

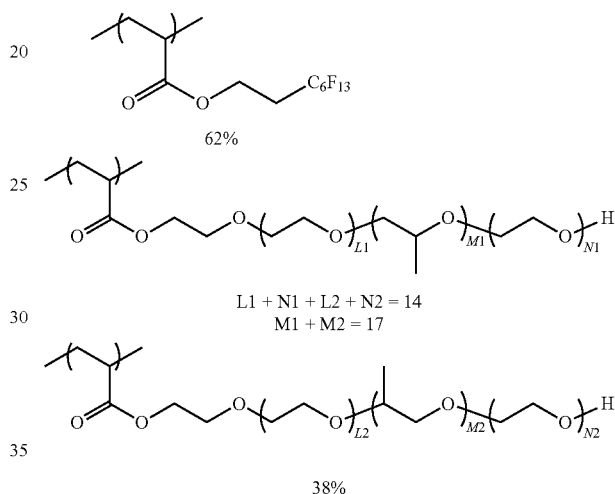

The weight-average molecular weight of the compounds is preferably 3,000 to 50,000, and is, for example, 14,000.

With regard to the fluorine-based surfactant, a fluorine-containing polymer having an ethylenically unsaturated group in a side chain can also be used as the fluorine-based surfactant. Specific examples thereof include the compounds described in paragraph Nos. 0050 to 0090 and paragraph Nos. 0289 to 0295 of JP2010-164965A, such as MEGAFACE RS-101, RS-102, and RS-718K, all of which are manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP341, KF6001, and KF6002 (all of which are manufactured by Shin-Etsu Chemical Co., Ltd.), and BYK307, BYK323, and BYK330 (all of which are manufactured by BYK Chemie).

The surfactants may be used singly or in combination of two or more kinds thereof.

The content of the surfactant is preferably 0.001% to 2.0% by mass, and more preferably 0.005% to 1.0% by mass, with respect to the total solid content of the photosensitive composition.

<<Silane Coupling Agent>>

IT is also preferable that the photosensitive composition of the present invention contains a silane coupling agent. The silane coupling agent means a silane compound having a hydrolyzable group and other functional groups. Further, the hydrolyzable group refers to a substituent that can be directly linked to a silicon atom to generate a siloxane bond by a hydrolysis reaction or a condensation reaction. Examples of the hydrolyzable group include a halogen atom, an alkoxy group, and an acyloxy group.

The silane coupling agent is also preferably a silane compound having an amino group and an alkoxy group as the functional group. Examples of such a silane coupling agent include N-β-aminoethyl-γ-aminopropylmethyl dimethoxysilane (trade name KBM-602, manufactured by Shin-Etsu Chemical Co., Ltd.), N-β-aminoethyl-γ-aminopropyl trimethoxysilane (trade name KBM-603, manufactured by Shin-Etsu Chemical Co., Ltd.), N-β-aminoethyl-γ-aminopropyltriethoxysilane (trade name KBE-602, manufactured by Shin-Etsu Chemical Co., Ltd.), γ-aminopropyltrimethoxysilane (trade name KBM-903, manufactured by Shin-Etsu Chemical Co., Ltd.), γ-aminopropyltriethoxysilane (trade name KBE-903, manufactured by Shin-Etsu Chemical Co., Ltd.), and 3-methacryloxypropyltrimethoxysilane (trade name KBM-503, manufactured by Shin-Etsu Chemical Co., Ltd.). With regard to the details of the silane coupling agent, reference can be made to the description in paragraph Nos. 0155 to 0158 of JP2013-254047A, the contents of which are incorporated herein by reference.

In a case where the photosensitive composition of the present invention contains a silane coupling agent, the content of the silane coupling agent is preferably 0.001% to 20% by mass, more preferably 0.01% to 10% by mass, and particularly preferably 0.1% by mass to 5% by mass, with respect to the total solid content of the photosensitive composition. The photosensitive composition of the present invention may include one kind or two or more kinds of the silane coupling agents. In a case where two or more kinds of the silane coupling agents are included, the total amount thereof preferably falls within the range.

<<Polymerization Inhibitor>>

It is also preferable that to the photosensitive composition of the present invention contains a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine salt (an ammonium salt, a cerous salt, or the like).

In a case where the photosensitive composition of the present invention contains a polymerization inhibitor, the content of the polymerization inhibitor is preferably 0.01% to 5% by mass with respect to the total solid content of the photosensitive composition. The photosensitive composition of the photosensitive invention may include one kind or two or more kinds of the polymerization inhibitor. In a case where two or more kinds of the polymerization inhibitors are included, the total amount thereof preferably falls within the range.

<<Ultraviolet Absorber>>

The photosensitive composition of the present invention may contain an ultraviolet absorber. As the ultraviolet absorber, a conjugated diene-based compound is preferable. Examples of commercially available products of the ultraviolet absorber include UV-503 (manufactured by Daito Chemical Co., Ltd.)

As an ultraviolet absorber, an ultraviolet absorber such as an aminodiene compound, a salicylate compound, a benzophenone compound, a benzotriazole compound, an acrylonitrile compound, or a triazine compound can be used. Specific examples thereof include the compounds described in JP2013-68814A. As the benzotriazole compound, MYUA series manufactured by Miyoshi Oil & Fat Co., Ltd. (The Chemical Daily, Feb. 1, 2016) may be used.

In a case where the photosensitive composition of the present invention contains an ultraviolet absorber, the content of the ultraviolet absorber is preferably 0.1% to 10% by mass, more preferably 0.1% to 5% by mass, and particularly preferably 0.1% to 3% by mass, with respect to the total solid content of the photosensitive composition. Further, in the present invention, the ultraviolet absorbers may be of one kind or two or more kinds. In a case where two or more kinds of the ultraviolet absorbers are included, the total amount thereof preferably falls within the range.

<<Other Additives>>

Various additives such as, for example, a filler, an adhesion promoter, an antioxidant, and an aggregation inhibitor can be blended into the photosensitive composition of the present invention, as desired. Examples of these additives include those described in paragraph Nos. 0155 and 0156 of JP2004-295116A, the contents of which are incorporated herein by reference. As the antioxidant, for example, a phenol compound, a phosphorus-based compound (for example, the compounds described in paragraph No. 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all of which are manufactured by ADEKA. The antioxidant may be used as a mixture of two or more kinds thereof. The photosensitive composition of the present invention may contain the sensitizers or the light stabilizers described in paragraph No. 0078 of JP2004-295116A, or the thermal polymerization inhibitors described in paragraph No. 0081 of the same publication.

There are some cases where a metal element is included in the photosensitive composition according to raw materials and the like, but from the viewpoint of suppression of generation of defects, or the like, the content of Group 2 elements (calcium, magnesium, and the like) in the photosensitive composition is preferably 50 ppm by mass or less, and preferably controlled to 0.01 to 10 ppm by mass. Further, the total amount of the inorganic metal salts in the photosensitive composition is preferably 100 ppm by mass or less, and is more preferably controlled to 0.5 to 50 ppm by mass.

<Method for Preparing Photosensitive Composition>

The photosensitive composition of the present invention can be prepared by mixing the above-mentioned components. In the preparation of the photosensitive composition, the respective components may be blended at once, or the respective components may be dissolved or dispersed in a solvent, and then sequentially blended. Further, the order of the components to be introduced or the operational conditions during the blending is not particularly limited. For example, the photosensitive composition may be prepared by dissolving or dispersing all the components in a solvent at the same time, or by appropriately leaving the respective components in two or more solutions or dispersion liquids, and mixing them into a solution during the use (during the coating), as desired.

It is preferable that in the preparation of the photosensitive composition, a composition formed by mixing the respective components is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density and ultra-high-molecular-weight polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter to the range, fine foreign matters can be reliably removed. In addition, a fibrous filter material is also preferably used. Examples of the fibrous filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, other filters may be combined therewith. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

The photosensitive composition of the present invention can also be used after its viscosity is adjusted for the purposes of adjusting the state of a film surface (flatness or the like), adjusting a film thickness, or the like. The value of the viscosity can be appropriately selected as desired, and is, for example, preferably 0.3 to 50 mPa·s, and more preferably 0.5 to 20 mPa·s at 25° C. As for a method for measuring the viscosity, the viscosity can be measured, for example, with a temperature being adjusted to 25° C., using a viscometer RE85L (rotor: 1°34'×R24, measurement range of 0.6 to 1,200 mPa·s) manufactured by Toki Sangyo Co., Ltd.

The moisture content in the photosensitive composition of the present invention is usually 3% by mass or less, preferably in the range of 0.01% to 1.5% by mass, and more preferably in the range of 0.1% to 1.0% by mass. The moisture content is a value measured by a Karl Fischer method.

<Color Filter>

Next, the color filter of the present invention will be described.

The color filter of the present invention is formed using the above-mentioned photosensitive composition of the present invention. The thickness of the color filter of the present invention can be appropriately adjusted, depending on the purposes. The thickness is preferably 20 µm or less, more preferably 10 µm or less, and still more preferably 5 µm or less. The lower limit of the thickness is preferably 0.1 µm or more, more preferably 0.2 µm or more, and still more preferably 0.3 µm or more. The color filter of the present invention can be used for a solid-state imaging device such as a charge-coupled device (CCD) and a complementary metal-oxide semiconductor (CMOS), an image display device, or the like.

In a case where the color filter of the present invention is used in applications for a liquid crystal display device, the voltage holding ratio of a liquid crystal display element including a color filter is preferably 70% or more, and more preferably 90% or more. Known means for obtaining a high voltage holding ratio can be incorporated as appropriate, and examples of typical means include a use of high-purity materials (for example, reduction in ionic impurities) and a control of the amount of acidic functional groups in a composition. The voltage holding ratio can be measured by, for example, the methods described in paragraph No. 0243 of JP2011-008004A, and paragraph Nos. 0123 to 0129 of JP2012-224847A.

<Pattern Forming Method>

The pattern forming method of the present invention includes a step of forming a photosensitive composition layer on a support, using the photosensitive composition of the present invention, a step of patternwise exposing the photosensitive composition layer, and a step of removing the unexposed area by development to form a pattern. A step of baking the photosensitive composition layer (pre-baking step), and a step of baking the developed pattern (post-baking step) may be provided, as desired.

A higher volume resistivity of each pattern (pixel) is more preferable. Specifically, the volume resistivity value of the pixel is preferably $10^9$ Ω·cm or more, and more preferably $10^{11}$ Ω·cm or more. The upper limit is not defined, but is, for example, preferably $10^{14}$ Ω·cm or less. The volume resistivity value of the pixel can be measured, for example, using an ultra high resistance meter 5410 (manufactured by Advantest Corporation).

<<Step of Forming Photosensitive Composition Layer>>

In the step of forming a photosensitive composition layer, the photosensitive composition layer is formed on a support, using the photosensitive composition.

A substrate for a solid-state imaging device, in which a solid-state imaging device (light-receiving element) such as a CCD and a CMOS is provided onto a substrate (for example, a silicon substrate), can be used as the support.

The photosensitive composition layer may be formed on the side (front surface) of a substrate for a solid-state imaging device, on which a solid-state imaging device is formed, or may be formed on the side (rear surface) on which a solid-state imaging device is not formed.

An undercoat layer may be provided on the support, as desired, so as to improve adhesiveness with a layer above the support, to prevent diffusion of materials, or to make a surface of the substrate flat.

As a method for applying the photosensitive composition onto the support, various coating methods such as slit coating, an ink jet method, spin coating, cast coating, roll coating, and a screen printing method can be used.

The photosensitive composition layer formed on the support may be dried (pre-baked). In a case of forming a pattern by a low-temperature process, pre-baking may not be performed.

In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials.

The pre-baking time is preferably 10 to 300 seconds, more preferably 40 to 250 seconds, and still more preferably 80 to 220 seconds. Pre-baking can be performed using a hot plate, an oven, or the like.

<<Exposing Step>>

Next, the photosensitive composition layer is patternwise exposed (exposing step). For example, the photosensitive composition layer can be subjected to patternwise exposure by performing exposure using an exposure device such as a stepper through a mask having a predetermined mask pattern. Thus, the exposed portion can be cured.

As the radiation (light) which can be used during the exposure, ultraviolet rays such as g-rays and i-rays are preferable, and i-rays are more preferable. The irradiation dose (exposure dose) is, for example, preferably 0.03 to 2.5 J/cm$^2$, and more preferably 0.05 to 1.0 J/cm$^2$.

The oxygen concentration during the exposure can be appropriately selected, and the exposure may also be performed, for example, in a low-oxygen atmosphere having an oxygen concentration of 19% by volume or less (for example, preferably 15% by volume, more preferably 5% by volume, and still more preferably, substantially oxygen-free) or in a high-oxygen atmosphere having an oxygen concentration of more than 21% by volume (for example, preferably 22% by volume, more preferably 30% by volume, and still more preferably 50% by volume). Further, the exposure illuminance can be appropriately set, and can be usually selected from a range of 1,000 W/m$^2$ to 100,000 W/m$^2$ (for example, preferably 5,000 W/m$^2$ or more, more preferably 15,000 W/m$^2$ or more, and still more preferably 35,000 W/m$^2$ or more). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<Developing Step>>

Next, the unexposed area is removed by development to form a pattern. The removal of the unexposed area by development can be carried out using a developer. Thus, the photosensitive composition layer of the unexposed area in the exposing step is eluted into the developer, and as a result, only a photocured portion remains.

As the developer, an alkali developer causing no damage on the underlying solid-state imaging device, circuit, or the like is preferable.

The temperature of the developer is preferably, for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as aqueous ammonia, ethylamine, diethylamine, dimethylethanolamine, diglycol amine, diethanolamine, hydroxylamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5,4,0]-7-undecene. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass.

In addition, an inorganic alkaline compound may be used as the alkali agent in a developer. As the inorganic alkaline compound, sodium hydroxide, potassium hydroxide, sodium carbonate, sodium hydrogen carbonate, sodium silicate, sodium metasilicate, or the like is preferable.

Moreover, a surfactant may also be used in the developer. Examples of the surfactant include the surfactants described as the above-mentioned curable composition, and the surfactant is preferably a nonionic surfactant.

Incidentally, in a case where a developer including such an aqueous alkaline solution is used, it is preferable that washing (rinsing) with pure water is generally performed after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. The Young's modulus of the film after post-baking is preferably 0.5 to 20 GPa, and more preferably 2.5 to 15 GPa. In addition, in a case of using an organic electroluminescence (organic EL) element as a light-emitting light source or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher.

The post-baking can be carried out continuously or batch-wise by using a heating means such as a hot plate, a convection oven (hot-air circulating dryer), and a highfrequency heater so that the film after development (cured film) satisfies the conditions. Further, in a case of forming a pattern by a low-temperature process, the post-baking may not be carried out.

The cured film preferably has high flatness. Specifically, the surface roughness Ra is preferably 100 nm or less, more preferably 40 nm or less, and still more preferably 15 nm or less. The lower limit is not specified, but is preferably, for example 0.1 nm or more. The surface roughness can be measured, for example, using AFM (atomic force microscope) Dimension 3100 manufactured by Veeco Instruments, Inc.

In addition, the contact angle of water on the cured film can be appropriately set to a preferred value, but is typically in the range of 50° to 110°. The contact angle can be measured, for example, using a contact angle meter CV-DT•A Model (manufactured by Kyowa Interface Science Co., Ltd.).

<Solid-State Imaging Device>

The solid-state imaging device of the present invention has the above-mentioned color filter of the present invention. The configuration of the solid-state imaging device of the present invention is not particularly limited as long as the solid-state imaging device is configured to include the color filter of the present invention and function as a solid-state imaging device. However, examples thereof include the following configurations.

The solid-state imaging device is configured to have a plurality of photodiodes constituting a light receiving area of the solid-state imaging device (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiode, on the photodiodes and the transfer electrodes; have a device-protective layer formed of silicon nitride or the like, which is formed to coat the entire surface of the light-shielding film and the light receiving portion of the photodiodes, on the light-shielding film; and have a color filter on the device-protective layer. In addition, the solid-state imaging device may also be configured, for example, such that it has a light collecting means (for example, a microlens, which is the same hereinafter) on a device-protective layer under a color filter (a side closer to the substrate), or has a light collecting means on a color filter. Further, the color filter may have a structure in which a cured film forming each color pixel is embedded in, for example, a space partitioned in a lattice shape by a partition wall. The partition wall in this case preferably has a low refractive index for each color pixel. Examples of an imaging device having such a structure include the devices described in JP2012-227478A and JP2014-179577A.

An imaging device including the solid-state imaging device of the present invention can also be used as a vehicle camera or a monitoring camera, in addition to a digital camera or electronic equipment (mobile phones or the like) having an imaging function.

<Image Display Device>

The color filter of the present invention can be used for an image display device such as a liquid crystal display device and an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be specifically described with reference to Examples. The materials, the amounts of materials to be used, the proportions, the treatment details, the treatment procedure, or the like shown in the Examples below may be modified, if appropriate, as long as the modifications do not depart from the spirit of the present invention. Therefore, the scope of the present invention should not be construed as being limited to the specific Examples shown below. In addition, "parts" and "%" are on a mass basis unless otherwise specified.

<Measurement of Weight-Average Molecular Weight>

The weight-average molecular weight of the resin was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow rate (amount of a sample to be injected): 1.0 μL (sample concentration: 0.1% by mass)

Device name: HLC-8220GPC manufactured by Tosoh Corporation

Detector: Refractive index (RI) detector

Calibration curve base resin: Polystyrene

<Measurement of Molar Light Absorption Coefficient at Wavelength of 365 nm of Photopolymerization Initiator>

A photopolymerization initiator was dissolved in acetonitrile to prepare a 5%-by-mole acetonitrile solution of the photopolymerization initiator. The acetonitrile solution prepared at the above-mentioned concentration was put into a glass cell having a width of 1 cm to measure an absorbance using a UV-Vis-NIR spectrophotometer (Cary 5000) manufactured by Agilent Technologies, Inc., and the absorbance was applied to the following equation to calculate a molar light absorption coefficient at a wavelength of 365 nm $(L \cdot mol^{-1} \cdot cm^{-1})$.

$$\varepsilon = \frac{A}{cl}$$

In the equation, ε represents a molar light absorption coefficient $(L \cdot mol^{-1} \cdot cm^{-1})$, A represents an absorbance, c represents a concentration (mol/L), and l represents the length (cm) of an optical path.

(Measurement of Optical Density (OD Value))

For the optical density of a film, light at a wavelength of 365 nm incident was made incident, and a transmittance thereof was measured using a spectroscope UV4100 (manufactured by Hitachi High-Technologies Corporation).

<Preparation of Pigment Dispersion Liquid>

A mixed solution with the following composition was mixed for 2 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing pigment dispersion liquids 1 to 6.

[Composition of Pigment Dispersion Liquid 1]
C. I. Pigment Green 58 . . . 12.1 parts
C. I. Pigment Yellow 185 . . . 3.0 parts
Resin (Disperbyk-101, manufactured by BYK Chemie) . . . 7.2 parts
Propylene glycol methyl ether acetate . . . 77.77 parts

[Composition of Pigment Dispersion Liquid 2]
C. I. Pigment Green 58 . . . 15.1 parts
Resin (Disperbyk-101, manufactured by BYK Chemie) . . . 7.2 parts
Propylene glycol methyl ether acetate . . . 77.77 parts

[Composition of Pigment Dispersion Liquid 3]
C. I. Pigment Yellow 139 . . . 12.9 parts
Resin (Disperbyk-101, manufactured by BYK Chemie) . . . 5.2 parts
Propylene glycol methyl ether acetate . . . 81.9 parts

[Composition of Pigment Dispersion Liquid 4]
C. I. Pigment Green 36 . . . 8.9 parts
C. I. Pigment Yellow 151 . . . 2.7 parts
Dispersant (SOLSEPERSE 20000: manufactured by Lubrizol Japan Ltd.) . . . 2.8 parts
Resin A (the resin A has the following structure and a weight-average molecular weight of 11,000; the ratio in repeating units is a molar ratio; and the resin A was synthesized by the method described in paragraph Nos. 0304 to 0307 of JP2012-173356A) . . . 5.5 parts

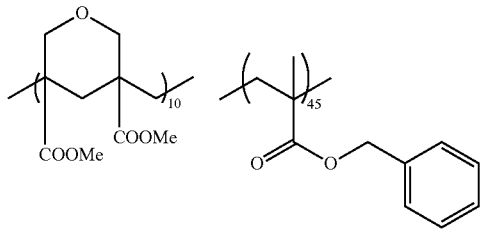

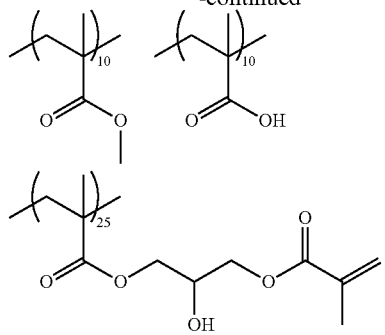

Propylene glycol methyl ether acetate . . . 80.0 parts

[Composition of Pigment Dispersion Liquid 5]

A pigment dispersion liquid 5 was prepared in the same manner as for the pigment dispersion liquid 1 except that C. I. Pigment Green 58 was changed to a halogenated zinc phthalocyanine pigment (bromine atoms:chlorine atoms:hydrogen atoms=10:3:3) in the pigment dispersion liquid 1.

<Preparation of Photosensitive Composition>

The raw materials shown in Table 1 were mixed and stirred at the proportions (parts by mass) shown in Table 1, and then filtered using a nylon-made filter (manufactured by Nihon Pall Corporation) with a pore diameter of 0.45 μm to prepare a photosensitive composition. Further, I/M in the following table is a ratio of the mass of the photopolymerization initiator to the mass of the polymerizable monomer (the mass of the photopolymerization initiator/the mass of the polymerizable monomer). In addition, the optical density at 365 nm of a film at a time of producing the film with a thickness of 2 μm, using each of the photosensitive compositions, was also described.

TABLE 1

| | | Example 1 | Example 2 | Example 3 | Example 4 | Example 5 | Example 6 |
|---|---|---|---|---|---|---|---|
| Pigment dispersion liquid | Pigment dispersion liquid 1 | 64.48 | 64.48 | 64.48 | 64.48 | 64.48 | 64.48 |
| | Pigment dispersion liquid 2 | | | | | | |
| | Pigment dispersion liquid 3 | | | | | | |
| | Pigment dispersion liquid 4 | | | | | | |
| | Pigment dispersion liquid 5 | | | | | | |
| Resin | Resin A | 0.20 | 0.20 | 0.20 | 0.20 | 0.20 | 0.20 |
| | Resin B | — | — | — | — | — | — |
| Polymerizable monomer | Polymerizable monomer A | 3.96 | 4.98 | 3.96 | 4.98 | 1.99 | — |
| | Polymerizable monomer B | 1.02 | — | 1.02 | — | 2.99 | — |
| | Polymerizable monomer C | — | — | — | — | — | — |
| | Polymerizable monomer D | — | — | — | — | — | — |
| | Polymerizable monomer E | — | — | — | — | — | 4.98 |
| Photopolymerization initiator | Photopolymerization initiator 1 | 0.50 | 0.60 | — | — | 0.50 | 0.60 |
| | Photopolymerization initiator 2 | — | — | 0.50 | 0.60 | — | — |
| | Photopolymerization initiator 3 | — | — | — | — | — | — |
| | Photopolymerization initiator 4 | — | — | — | — | — | — |
| | Polymerization inhibitor | 0.002 | 0.002 | 0.002 | 0.002 | 0.002 | 0.002 |
| | Organic solvent 1 | 29.15 | 29.15 | 29.15 | 29.15 | 29.15 | 29.15 |
| | Organic solvent 2 | | | | | | |
| | Epoxy compound | | | | | | |
| | Ultraviolet absorber | | | | | | |
| | Surfactant | 0.83 | 0.83 | 0.83 | 0.83 | 0.83 | 0.83 |
| | I/M | 0.10 | 0.12 | 0.10 | 0.12 | 0.10 | 0.12 |
| | Optical density at 365 nm with film thickness of 2 μm | 2.80 | 2.80 | 2.80 | 2.80 | 2.80 | 2.80 |

TABLE 1-continued

|  |  | Example 7 | Example 8 | Example 9 | Example 10 | Comparative Example 1 | Comparative Example 2 |
|---|---|---|---|---|---|---|---|
| Pigment dispersion liquid | Pigment dispersion liquid 1 | 64.48 | 64.48 | 64.48 | — | — | — |
|  | Pigment dispersion liquid 2 | — | — | — | — | 54.20 | — |
|  | Pigment dispersion liquid 3 | — | — | — | — | 30.70 | — |
|  | Pigment dispersion liquid 4 | — | — | — | — | — | 49.3 |
|  | Pigment dispersion liquid 5 | — | — | — | 64.48 | — | — |
| Resin | Resin A | 0.20 | 0.20 | 0.20 | 0.20 | 0.12 | — |
|  | Resin B | — | — | — | — | — | 7.2 |
| Polymerizable monomer | Polymerizable monomer A | 4.98 | 4.98 | 4.77 | 3.96 | — | — |
|  | Polymerizable monomer B | — | — | — | 1.02 | — | 2.25 |
|  | Polymerizable monomer C | — | — | — | — | 2.10 | — |
|  | Polymerizable monomer D | — | — | — | — | 2.10 | — |
|  | Polymerizable monomer E | — | — | — | — | — | — |
| Photopolymerization initiator | Photopolymerization initiator 1 | 0.30 | — | 0.71 | 0.50 | — | 0.22 |
|  | Photopolymerization initiator 2 | — | 0.30 | — | — | — | — |
|  | Photopolymerization initiator 3 | — | — | — | — | 0.87 | — |
|  | Photopolymerization initiator 4 | 0.30 | 0.30 | — | — | — | — |
|  | Polymerization inhibitor | 0.002 | 0.002 | 0.002 | 0.002 | 0.002 | 0.002 |
|  | Organic solvent 1 | 29.15 | 29.15 | 29.15 | 29.15 | 7.10 | — |
|  | Organic solvent 2 | — | — | — | — | — | 41.1 |
|  | Epoxy compound | — | — | — | — | 1.15 | — |
|  | Ultraviolet absorber | — | — | — | — | 0.69 | — |
|  | Surfactant | 0.83 | 0.83 | 0.83 | 0.83 | 0.83 | 0.83 |
|  | I/M | 0.12 | 0.12 | 0.15 | 0.10 | 0.21 | 0.10 |
|  | Optical density at 365 nm with film thickness of 2 μm | 2.80 | 2.80 | 2.80 | 2.80 | 2.80 | 2.71 |

|  |  | Comparative Example 3 | Comparative Example 4 | Comparative Example 5 | Comparative Example 6 | Comparative Example 7 | Comparative Example 8 |
|---|---|---|---|---|---|---|---|
| Pigment dispersion liquid | Pigment dispersion liquid 1 | 64.48 | 64.48 | 64.48 | 64.48 | 64.48 | 64.48 |
|  | Pigment dispersion liquid 2 | — | — | — | — | — | — |
|  | Pigment dispersion liquid 3 | — | — | — | — | — | — |
|  | Pigment dispersion liquid 4 | — | — | — | — | — | — |
|  | Pigment dispersion liquid 5 | — | — | — | — | — | — |
| Resin | Resin A | 0.20 | 0.20 | 0.20 | 0.20 | 0.20 | 0.20 |
|  | Resin B | — | — | — | — | — | — |
| Polymerizable monomer | Polymerizable monomer A | 3.88 | 4.98 | 4.98 | — | — | 3.51 |
|  | Polymerizable monomer B | 0.88 | — | — | 4.98 | 4.98 | 0.90 |
|  | Polymerizable monomer C | — | — | — | — | — | — |
|  | Polymerizable monomer D | — | — | — | — | — | — |
|  | Polymerizable monomer E | — | — | — | — | — | — |
| Photopolymerization initiator | Photopolymerization initiator 1 | 0.75 | — | — | 0.60 | — | 1.32 |
|  | Photopolymerization initiator 2 | — | — | — | — | 0.60 | — |
|  | Photopolymerization initiator 3 | — | 0.60 | — | — | — | — |
|  | Photopolymerization initiator 4 | — | — | 0.60 | — | — | — |
|  | Polymerization inhibitor | 0.002 | 0.002 | 0.002 | 0.002 | 0.002 | 0.002 |
|  | Organic solvent 1 | 29.15 | 29.15 | 29.15 | 29.15 | 29.15 | 29.15 |
|  | Organic solvent 2 | — | — | — | — | — | — |
|  | Epoxy compound | — | — | — | — | — | — |
|  | Ultraviolet absorber | — | — | — | — | — | — |
|  | Surfactant | 0.83 | 0.83 | 0.83 | 0.83 | 0.83 | 0.83 |
|  | I/M | 0.16 | 0.12 | 0.12 | 0.12 | 0.12 | 0.30 |
|  | Optical density at 365 nm with film thickness of 2 μm | 2.80 | 2.80 | 2.80 | 2.80 | 2.80 | 2.80 |

The raw materials shown in the above table are as follows.

Pigment dispersion liquid 1 to 5: Pigment dispersion liquids 1 to 5 above

Resin A: Resin A above

Resin B: A copolymer of methacrylic acid, methyl methacrylate, n-butyl methacrylate, and 2-hydroxyethyl methacrylate was synthesized by the method described in paragraph No. 0071 of JP2010-256891A. The weight-average molecular weight of the obtained resin B was 40,000.

Polymerizable monomer A: ARONIX M-350 (manufactured by Toagosei Chemical Industry Co., Ltd., a compound having the following structure)

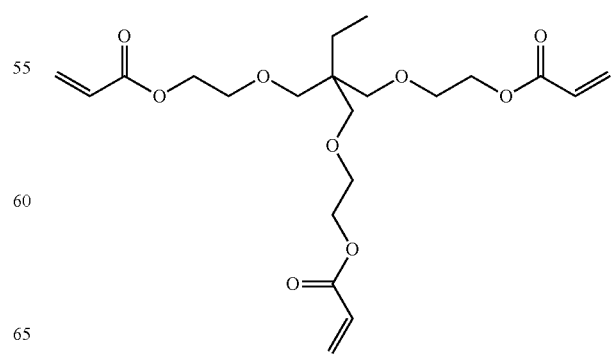

Polymerizable monomer B: KAYARAD DPCA (manufactured by Nippon Kayaku Co., Ltd., a mixture of the left compound and the right compound at a molar ratio of 7:3)

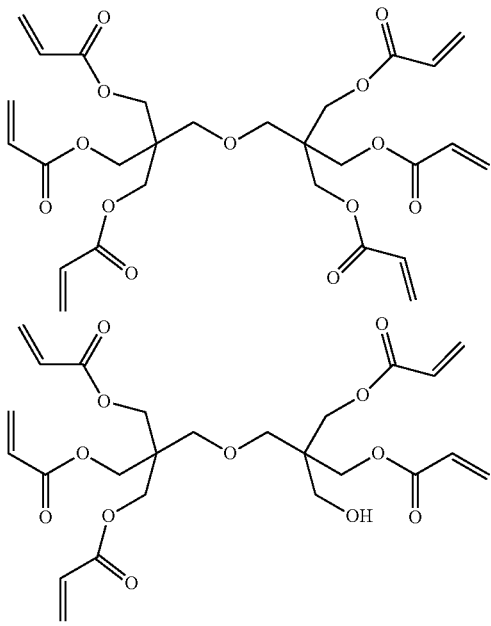

Polymerizable monomer C: NK ESTER A-DPH-12E (manufactured by Shin-Nakamura Chemical Co., Ltd., dipentaerythritolhexaacrylate)
Polymerizable monomer D: NK ESTER A-TMM-3 (manufactured by Shin-Nakamura Chemical Co., Ltd.)

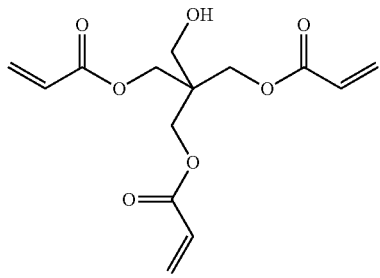 [SMILES: C=CC(=O)OCC(CO)(COC(=O)C=C)COC(=O)C=C]

Polymerizable monomer E: KAYARAD TMPTA (manufactured by Nippon Kayaku Co., Ltd., trimethylolpropane triacrylate)
Photopolymerization initiator 1: The following compound (molar light absorption coefficient at a wavelength of 365 nm=12,600 L·mol$^{-1}$·cm$^{-1}$)

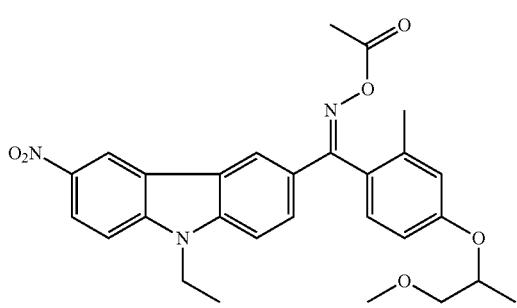 [SMILES: CCn1c2ccc(/C(=N/OC(C)=O)c3ccc(OC(C)COC)cc3C)cc2c2cc([N+](=O)[O-])ccc21]

Photopolymerization initiator 2: The following compound (molar light absorption coefficient at a wavelength of 365 nm=17,700 L·mol$^{-1}$·cm$^{-1}$)

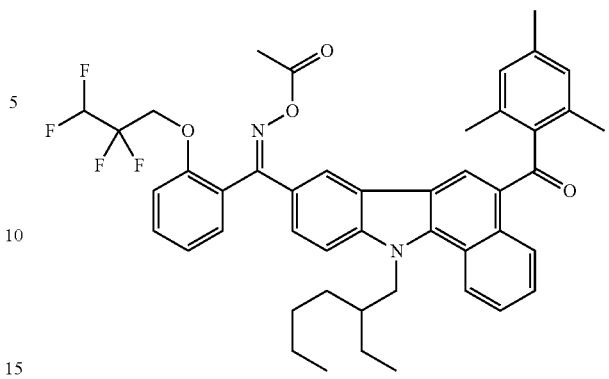

Photopolymerization initiator 3: IRGACURE-OXE02 (manufactured by BASF, molar light absorption coefficient at a wavelength of 365 nm=4,800 L·mol$^{-1}$·cm$^{-1}$)
Photopolymerization initiator 4: IRGACURE-OXE01 (manufactured by BASF, molar light absorption coefficient at a wavelength of 365 nm=3,300 L·mol$^{-1}$·cm$^{-1}$)
Polymerization inhibitor: p-Methoxyphenol
Organic solvent 1: Propylene glycol methyl ether acetate
Organic solvent 2: Cyclohexanone
Epoxy compound: EHPE3105 (manufactured by Daicel Corporation)
Ultraviolet absorber: UV-503 (manufactured by Daito Chemical Co., Ltd.)
Surfactant: The following mixture (weight-average molecular weight=14,000). In the following formulae, % representing the ratio of the repeating units is % by mass.

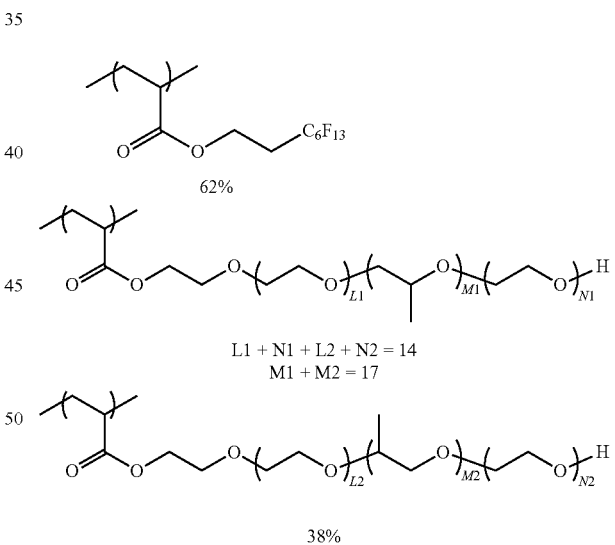

<Pattern Formation>
CT-4000L (manufactured by Fujifilm Electronic Materials Co., Ltd.) was applied onto a 8-inch (1 inch=2.54 mm) silicon wafer, using a spin coater, such that the film thickness after post-baking became 0.1 μm, and heated at 220° C. for 300 seconds using a hot plate to form an undercoat layer, thereby obtaining a silicon wafer (support) having the undercoat layer thereon.

The photosensitive composition was applied onto the silicon wafer (support) having the undercoat layer thereon, using a spin coater, such that the film thickness after drying became 2 μm, and subjected to a heating treatment (pre-baking) at 100° C. for 120 seconds using a hot plate. Subsequently, the film was subjected to pattern exposure through a mask with a pattern having a side length of 3.0 μm, using an i-ray (a wavelength of 365 nm) stepper exposure device FPA-5510iZ (manufactured by Canon Inc.) under the following pattern exposure conditions. Thereafter, the support having the pattern-exposed film formed thereon was placed on a horizontal rotary table of a spin-shower developing machine (DW-30 Type, manufactured by Chemitronics Co., Ltd.), and subjected to puddle development at 23° C. for 60 seconds using CD-2060 (manufactured by Fujifilm Electronic Materials Co., Ltd.), thereby forming a pattern.

The support having the pattern formed thereon was fixed on a horizontal rotary table in a vacuum chuck system, and while rotating the substrate at a rotation speed of 200 rpm using a rotation device, the substrate was subjected to a rinsing treatment for 30 seconds by supplying pure water to the wafer from a spray nozzle in the form of a shower from the position above the rotation center, and then spin-dried.

The obtained pattern was subjected to a heating treatment (post-baking) at 220° C. for 300 seconds to prepare a Bayer pattern with a width of a pixel portion having a side length of 3.0 μm.

The conditions for pattern exposure are as follows.
Conditions for illumination: $NA_3/\sigma=0.57/0.40$
Exposure illuminance ($W/m^2$): 10,000
Exposure dose: An optimum exposure energy test (Eopt) was carried out with an exposure dose varying at steps from 25 $mJ/cm^2$ to 1,700 $mJ/cm^2$. Further, the optimum exposure energy is a condition for exposure energy under which mask design values can be reproduced on a wafer.
Oxygen concentration (% by volume): 21% by volume (atmospheric condition)

Measurement of a line width after patterning was carried out by performing observation using a line width measuring electron microscope S9260A (manufactured by Hitachi High-Technologies Corporation). An average value of the pixel-measuring dimensions at five points was defined as a set value of a line width.

<Evaluation of Pattern Forming Properties>
An optimum exposure energy (Eopt) for resolving the pattern (Bayer pattern having a side length of 3.0 μm) was determined, and the pattern forming properties were evaluated in accordance with the following standard.
A: Eopt is from 300 $mJ/cm^2$ to 1,000 $mJ/cm^2$
B: Eopt is 50 $mJ/cm^2$ or more and less than 300 $mJ/cm^2$, or more than 1,000 $mJ/cm^2$ and 1,700 $mJ/cm^2$ or less
C: Eopt is less than 50 $mJ/cm^2$ or more than 1,700 $mJ/cm^2$ <Evaluation of Adhesiveness>
An exposure dose at which a Bayer pattern having a side length of 3.0 μm is not peeled at all (adhesion exposure dose) was determined, and the adhesiveness was evaluated in accordance with the following standard.
A: Eopt>Adhesion exposure dose
B: Eopt=Adhesion exposure dose
C: Eopt<Adhesion exposure dose <Residual Film Rates after Development>
CT-4000L (manufactured by Fujifilm Electronic Materials Co., Ltd.) was applied onto a 8-inch (1 inch=2.54 mm) silicon wafer, using a spin coater, such that the film thickness after post-baking became 0.1 μm, and heated (post-baked) at 220° C. for 300 seconds using a hot plate to form an undercoat layer, thereby obtaining a silicon wafer (support) having the undercoat layer thereon.

The photosensitive composition was applied onto the silicon wafer (support) having the undercoat layer thereon, using a spin coater, such that the film thickness after drying became 2 μm, and subjected to a heating treatment (pre-baking) at 100° C. for 120 seconds using a hot plate. Subsequently, the film was subjected to pattern exposure through a mask with an island pattern having a side length of 2 cm, using an i-ray (a wavelength of 365 nm) stepper exposure device FPA-5510iZ (manufactured by Canon Inc.) under the following pattern exposure conditions. Thereafter, the support having the pattern-exposed film formed thereon was placed on a horizontal rotary table of a spin-shower developing machine (DW-30 Type, manufactured by Chemitronics Co., Ltd.), and subjected to puddle development at 23° C. for 60 seconds using CD-2060 (manufactured by Fujifilm Electronic Materials Co., Ltd.), thereby forming a pattern.

The support having the pattern formed thereon was fixed on a horizontal rotary table in a vacuum chuck system, and while rotating the substrate at a rotation speed of 200 rpm using a rotation device, the substrate was subjected to a rinsing treatment for 30 seconds by supplying pure water to the wafer from a spray nozzle in the form of a shower from the position above the rotation center, and then spin-dried.

The conditions for pattern exposure are as follows.
Conditions for illumination: $NA_3/\sigma=0.57/0.40$
Exposure illuminance ($W/m^2$): 10,000
Exposure dose: An exposure dose varies at steps from 25 $mJ/cm^2$ to 1,700 $mJ/cm^2$, and the thickness of a pattern thus obtained at each exposure dose was measured using a non-contact type thickness gauge (F-50, manufacture by Mikasa Co., Ltd.). The residual film rate of Eopt in the Bayer pattern having a side length of 3.0 μm was evaluated as follows.

Furthermore, the residual film rate is a ratio of the film thickness after development to the film thickness before development.
A: The residual film rate is 95% or more
B: The residual film rate is 90% or more and less than 95%
C: The residual film rate is less than 90%

TABLE 2

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Film thickness (μm) | 2 | 2 | 2 | 2 | 2 | 2 | 2 | 2 | 2 | 2 |
| Pattern forming properties | A | A | A | A | B | B | A | A | B | A |
| Adhesiveness | A | A | A | A | B | B | A | A | B | A |
| Residual film rate | A | B | A | B | A | B | A | A | A | A |

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Film thickness (μm) | 2 | 2 | 2 | 2 | 2 | 2 | 2 | 2 |
| Pattern forming properties | C | C | C | C | C | C | C | C |

TABLE 2-continued

| Adhesiveness | C | A | A | C | C | C | C | C |
|---|---|---|---|---|---|---|---|---|
| Residual film rate | C | C | A | C | C | A | A | A |

As shown in the above table, in Examples, the adhesiveness and the pattern forming properties were excellent. On the other hand, in Comparative Examples, at least one of adhesiveness or pattern forming properties was deteriorated, as compared with Examples.

What is claimed is:

1. A photosensitive composition comprising:
   a photopolymerization initiator I;
   a polymerizable monomer M having two or more groups having an ethylenically unsaturated double bond; and
   a halogenated zinc phthalocyanine,
   wherein the polymerizable monomer M contains a polymerizable monomer $M^1$ having three groups having an ethylenically unsaturated double bond,
   the photopolymerization initiator I includes a photopolymerization initiator $I^1$ having a molar light absorption coefficient at a wavelength of 365 nm of 12,000 L·mol$^{-1}$·cm$^{-1}$ or more, and
   the ratio of the mass of the photopolymerization initiator I to the mass of the polymerizable monomer M is 0.15 or less in terms of the mass of the photopolymerization initiator I/the mass of the polymerizable monomer M.

2. The photosensitive composition according to claim 1, wherein the polymerizable monomer M contains 50% to 100% by mass of the polymerizable monomer $M^1$.

3. The photosensitive composition according to claim 1, wherein the polymerizable monomer $M^1$ has an alkyleneoxy group.

4. The photosensitive composition according to claim 1, wherein the photopolymerization initiator $I^1$ includes at least one selected from an oxime compound having a nitro group and an oxime compound having a naphthalene ring.

5. The photosensitive composition according to of claim 1,
   wherein the photopolymerization initiator $I^1$ contains a compound represented by Formula (I-1),

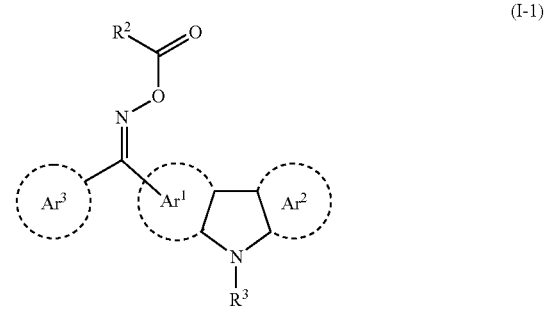

(I-1)

in Formula (I-1), $Ar^1$ and $Ar^2$ each independently represent an aromatic ring,
$Ar^3$ represents an aryl group,
$R^2$ and $R^3$ each independently represent an alkyl group or an aryl group, and
at least one of $Ar^1$ to $Ar^3$, $R^2$, and $R^3$ has a fluorine atom, a group including a fluorine atom, or a nitro group as a substituent.

6. The photosensitive composition according to claim 1, wherein the polymerizable monomer M contains 50% by mass or less of a polymerizable monomer $M^2$ having four or more groups having an ethylenically unsaturated double bond.

7. A color filter using the photosensitive composition according to claim 1.

8. A solid-state imaging device comprising the color filter according to claim 7.

9. An image display device comprising the color filter according to claim 7.

10. A pattern forming method comprising:
    forming a photosensitive composition layer on a support, using the photosensitive composition according to claim 1;
    patternwise-exposing the photosensitive composition layer; and
    removing the unexposed area by development to form a pattern.

11. The pattern forming method according to claim 10, wherein the exposure is carried out with i-rays.

* * * * *